United States Patent
Kurihara et al.

(10) Patent No.: US 12,352,927 B2
(45) Date of Patent: Jul. 8, 2025

(54) ANTIREFLECTION STRUCTURE AND MANUFACTURING METHOD THEREOF

(71) Applicants: National Institute of Advanced Industrial Science and Technology, Tokyo (JP); Toa Electric Industrial Co., Ltd., Tokyo (JP)

(72) Inventors: Kazuma Kurihara, Ibaraki (JP); Ryohei Hokari, Ibaraki (JP); Hiroaki Fukui, Tokyo (JP)

(73) Assignees: National Institute of Advanced Industrial Science and Technology, Tokyo (JP); Mitsubishi Gas Chemical Trading, Inc., Tokyo (JP)

( * ) Notice: Subject to any disclaimer, the term of this patent is extended or adjusted under 35 U.S.C. 154(b) by 500 days.

(21) Appl. No.: 17/806,811

(22) Filed: Jun. 14, 2022

(65) Prior Publication Data

US 2022/0317337 A1    Oct. 6, 2022

Related U.S. Application Data

(63) Continuation of application No. PCT/JP2020/046890, filed on Dec. 16, 2020.

(30) Foreign Application Priority Data

Dec. 17, 2019  (JP) .................................. 2019-227726

(51) Int. Cl.
*G02B 1/118*    (2015.01)
*C03C 17/245*    (2006.01)

(52) U.S. Cl.
CPC ............ *G02B 1/118* (2013.01); *C03C 17/245* (2013.01); *C03C 2217/213* (2013.01);
(Continued)

(58) Field of Classification Search
None
See application file for complete search history.

(56) References Cited

U.S. PATENT DOCUMENTS

2003/0102286 A1    6/2003  Takahara et al.
2010/0033819 A1    2/2010  Schulz et al.
(Continued)

FOREIGN PATENT DOCUMENTS

CN    104395783 A    3/2015
JP    S62-73203 A    4/1987
(Continued)

OTHER PUBLICATIONS

Office Action for CN202080077166.7 issued by China National Intellectual Property Administration dated on Nov. 14, 2023.
(Continued)

*Primary Examiner* — Ryan Crockett
(74) *Attorney, Agent, or Firm* — Kubotera & Associate, LLC

(57) ABSTRACT

An antireflection structure comprising a transparent substrate having a plurality of holes with U-shaped or V-shaped cross-sectional shapes perpendicular to a flat surface portion and a metal oxide film disposed on the surface portion of the transparent substrate and in the space portions formed in an upward direction from the bottom portions of holes in the transparent substrate, wherein the average diameter of the openings of the holes is 50 nm to 300 nm, the average distance between the center points of openings of the adjacent holes is 100 nm to 400 nm, and the depth of each hole from the surface portion of the substrate is 80 nm to 250 nm; and the thickness of the metal oxide film disposed in each of the space portions increases as the depth of each of the holes becomes larger, thereby reducing the difference in depth between the holes from the uppermost surface portion of the metal oxide film disposed on the surface portion to the
(Continued)

surface portions of the metal oxide films in the space portions.

16 Claims, 10 Drawing Sheets

(52) U.S. Cl.
CPC .... *C03C 2217/73* (2013.01); *C03C 2218/156* (2013.01); *G02B 2207/101* (2013.01)

(56) References Cited

U.S. PATENT DOCUMENTS

| | | |
|---|---|---|
| 2013/0003181 A1 | 1/2013 | Hayashibe et al. |
| 2015/0177420 A1* | 6/2015 | Fujii ........................ G02B 1/04 359/601 |
| 2015/0309214 A1 | 10/2015 | Schulz et al. |
| 2016/0216409 A1 | 7/2016 | Schulz et al. |
| 2018/0059291 A1* | 3/2018 | Li .......................... G02B 1/118 |

FOREIGN PATENT DOCUMENTS

| | | |
|---|---|---|
| JP | 1996-281692 A | 10/1996 |
| JP | 1998-314256 A | 11/1999 |
| JP | 2001-272505 A | 10/2001 |
| JP | 2006-243633 A | 9/2006 |
| JP | 2007-322763 A | 12/2007 |
| JP | 2014-170071 A | 9/2014 |
| JP | 2015-001578 A | 1/2015 |
| JP | 2016-139138 A | 8/2016 |

OTHER PUBLICATIONS

Extended European Search Report for EP20902491.8 issued by European Patent Office dated Dec. 22, 2023.
International Search Report for JP/PCT2020/046890 issued by ISA/JP dated Mar. 9, 2021.

* cited by examiner

ANTIREFLECTION STRUCTURE AND MANUFACTURING METHOD THEREOF

CROSS-REFERENCE TO RELATED APPLICATIONS

This is a continuation application of a prior PCT application No. PCT/JP2020/046890 filed on Dec. 12, 2020.

TECHNICAL FIELD AND BACKGROUND ART

The present invention relates to an antireflection structure having functions such as an optical antireflection function, a hydrophilic function and the like, and to a manufacturing method thereof. The contents of the Japanese patent application (JP 2019-227726) filed on Dec. 17, 2019, which is the basis of the present application, are incorporated by reference herein as part of this specification.

Conventionally, in an optical element made of glass, resin, or the like, a surface treatment is performed in order to reduce return light due to surface reflection and to increase transmitted light. As a specific method of this surface treatment, a method of periodically forming fine and dense uneven shapes on the surface portion of an optical element is known. In this way, when a periodic concave-convex shape is provided on the surface portion of the optical element, light is diffracted as it passes through the optical element surface, and the straight component of the transmitted light is greatly reduced.

Meanwhile, when the pitch of the concave-convex shape formed on the surface portion of the optical element is shorter than the wavelength of the transmitted light, it is possible to obtain an effective antireflection effect for the light having a wavelength corresponding to the pitch, the depth, and the like because the light does not diffract.

Furthermore, by using a so-called pyramidal shape (pyramidal pattern) where the ratio of the volume of the peaks and valleys, or the optical element material side to the air side, changes continuously, rather than a rectangular shape, it is possible to obtain an antireflection effect for light with a wide wavelength range (see, for example, Patent Document 1 and Patent Document 2).

In order to realize a structure that prevents reflection over a wide wavelength range, it is desirable to form a structure with a nanometer-sized concave-convex structure (hereinafter sometimes referred to as a "nanostructure") with a fine concave-convex patterns below the wavelength and a relatively high aspect ratio. Such structures can be manufactured by processing methods such as etching using semiconductor processes or aluminum anodization. In addition, in order to realize these antireflection structures at low cost, it is desirable to mold them by press molding, injection molding, casting molding, etc., using a mold composed of nanostructures with concave-convex patterns with a relatively high aspect ratio formed on the surface. It has been proposed that the concavo-convex pattern spacing of the nanostructure can be kept below the wavelength, and the height (or depth) of its concave-convex shape (denoting the wavelength by $\lambda$ and the refractive index of the structure by n) can be controlled to be about $\lambda/4n$ to $\lambda/2n$ of the wavelength, and can be molded at low cost by transfer molding (see Patent Document 3 and Patent Document 4).

REFERENCE DOCUMENTS

Patent document 1: Japanese Patent Publication No. JP 2001-272505A

Patent document 2: Japanese Patent Publication No. JP 2006-243633A

Patent document 3: Japanese Patent Publication No. JP 1996-281692A

Patent document 4: Japanese Patent Publication No. JP 1999-314256A

SUMMARY OF THE INVENTION

When using nanostructures to manufacture antireflection structures as in the conventional technology described above, the wavelength to prevent reflection is determined by the depth of the concave-convex shape of the structure, so the depth of the concave-convex shape needs to be controlled. In the case of direct processing of quartz, silicon, etc. into nanostructures with concave-convex surfaces, etc., the specified concave-convex structure is formed by using an etching process to process the concave-convex surface, or by transfer molding using a mold.

However, in the manufacture of these nanostructures, the actual depth of the recesses of the nanostructures is prone to error during commercial production and processing, and since depth errors affect the wavelength characteristics of the antireflection, precise machining process and molding processes with minimal depth error are required.

In addition, when injection molding or hot emboss molding is performed using a mold in which the nanostructure shape is formed, if unevenness in the temperature distribution of the mold, the temperature distribution and pressure distribution of the filled resin, and variation occurs in the transfer distribution of the nanostructure, variations in the depth of the nanostructures are also likely to occur. As a result, the antireflection properties of the nanostructures are determined by the depth of the concave shape of the structure, making it difficult to produce molded products with uniform antireflection properties and low reflection.

In particular, the aforementioned problem becomes remarkable when the area is large or the surface is curved, and there is also a problem that sufficient correction of an error due to variation in depth cannot be performed.

In order to solve the above-mentioned problem, in the nanostructures which are prone to depth variation in the uneven shape during processing, the purpose of this invention is to provide antireflection structures with excellent in-plane uniformity of optical properties and excellent antireflection optical properties for a wide wavelength band and a wider angle of incidence, by forming thicker columnar films in the deeper recessed portions to reduce the depth variation from the uppermost surface portion of the structure to the surface portion of the columnar film in the concave portion, and to provide a manufacturing method thereof.

In view of the above prior art, the present inventors have focused on the point that the collision between the thin-film forming particles and inert gas particles is enhanced and the mean free path of these particles becomes shorter by setting the pressure in the vacuum chamber to a lower level than that normally used in the vacuum deposition method (i.e., the pressure is set relatively high), when a thin film or the like is formed by a vacuum film deposition on a surface portion and inside the holes of a nanostructure in which a plurality of holes, that have hole diameters of nanometer size less than the wavelength of the light to be prevented from being reflected and that have an average distance between the center points of the openings less than the wavelength of the light, are formed on a surface portion of a flat transparent substrate.

It has been found that, under such vacuum conditions, even if there is a variation in the depth of the plurality of holes formed in the nanostructure before the thin film is formed, the thickness of the columnar film formed inside the holes increases as the depth of each of the holes before deposition becomes larger, and the difference in depth between the holes decreases, resulting in an antireflection structure with improved antireflection properties. It has been also found that a substrate with an improved hydrophilic effect and anti-fogging effect can be obtained when a columnar film made of metal oxide is formed inside each hole of the substrate. The present invention has been completed based on these findings.

The gist of the preset invention is the invention summarized in the following (1) to (17).

(1) An antireflection structure comprising a transparent substrate (B) having a plurality of holes (Hn) with U-shaped or V-shaped cross-sectional shapes in a direction perpendicular to a flat surface portion thereof, and a metal oxide film disposed on the surface portion (S) of the transparent substrate (B) and in space portions (Cn) formed in an upward direction from the bottom portion of holes (Hn) of the transparent substrate (B), wherein each of the holes (Hn) has a geometry in which an average diameter (m) of openings of the holes (Hn) is 50 nm to 300 nm, an average distance (k) between center points of the openings of adjacent holes (Hn) is 100 nm to 400 nm, and a depth (dn) of each hole (Hn) from the surface portion (S) is 80 nm to 250 nm; and wherein a thickness (tn) of the metal oxide film disposed in each of the space portions (Cn) increases as the depth (dn) of each of the holes (Hn) becomes larger, so that differences in depth (fn) between the respective holes (Hn) from an uppermost surface portion (Sm) of the metal oxide film disposed on the surface portion (S) to a surface portion of the metal oxide film in the space portion (Cn) are reduced.

(2) The antireflection structure in the above paragraph (1), wherein the metal oxide film disposed on the surface portion (S) of the substrate (B) is the thin film, and the metal oxide films disposed in the space portions (Cn) in an upper direction from the bottom of each hole (Hn) is a fibrous columnar film.

(3) The antireflection structure in the above paragraph (1) or (2), wherein an arithmetic average roughness (Ra) of the surface portion (S) of the substrate (B) is 50 nm or less, and a percentage of the area of the opening portion (aperture ratio) (r) of the surface portion (S) is 50 to 80 area %.

(4) The antireflection structure in any of above paragraphs (1) to (3), wherein the thickness (p) of the metal oxide film disposed on the surface portion (S) of the substrate (B) is 20 nm to 60 nm.

(5) The antireflection structure in any of above paragraphs (1) to (4), wherein the thickness (p) of the metal oxide film disposed on the surface portion (S) of the substrate (B) is 20 nm to 40 nm, and the depth (fn (nm)) of each hole (Hn) from the uppermost surface portion (Sm) of the substrate (B) to the surface portion of the metal oxide film disposed in the space portion (Cn) in the upper direction from the bottom of the hole (Hn) falls within the range represented by the following formula (i).

$$fn=[(0.195dn+95.5)+(p-25)] \times 0.90 \text{ to } [(0.195dn+95.5)+(p-25)] \times 1.10 \quad (i)$$

wherein the depth of each hole (Hn) from the surface portion (S) is represented by dn (nm), and the thickness of the metal oxide film disposed on the surface portion (S) is represented by p (nm).

(6) The antireflection structure in any of above paragraphs (1) to (4), wherein the thickness (p) of the metal oxide film disposed on the surface portion (S) of the substrate (B) is 20 nm to 40 nm, and the depth (fn (nm)) of each hole (Hn) from the uppermost surface portion (Sm) of the substrate (B) to the surface portion of the metal oxide film formed in the space portion (Cn) in the upper direction from the bottom of holes (Hn) falls within the range represented by the following formula (ii).

$$fn=[(0.195dn+95.5)+(p-25)] \times 0.95 \text{ to } [(0.195dn+95.5)+(p-25)] \times 1.05 \quad (ii)$$

wherein the depth of each hole (Hn) from the surface portion (S) is represented by dn (nm), the thickness of the metal oxide film disposed on the surface portion (S) is represented by p (nm).

(7) The antireflection structure in any of above paragraphs (1) to (6), wherein the metal oxide forming the metal oxide film is one of silicon oxide, aluminum oxide, titanium oxide, and zirconium oxide.

(8) The antireflection structure in any of above paragraphs (1) to (7), wherein the metal oxide film formed on the surface portion (S) and the metal oxide film formed in the space portion (Cn) in the upper direction from the bottom of each hole (Hn) are films depositing by a vacuum film deposition apparatus having a plasma source.

(9) A method for manufacturing an antireflection structure, comprising depositing a metal oxide film on a transparent substrate (B) having a plurality of holes (Hn) with a U-shaped or V-shaped cross-sectional shape in a direction perpendicular to a flat surface portion thereof, wherein each of the holes (Hn) has a geometry in which an average diameter (m) of an opening of the holes (Hn) is 50 nm to 300 nm, an average distance (k) between the center points of openings of the adjacent holes (Hn) is 100 nm to 400 nm, and a depth (dn) of each of holes (Hn) from the surface portion (S) is 80 nm to 250 nm, and wherein said depositing is by vacuum deposition that is carried out under the following conditions (a), (b), and (c) by using a vacuum film deposition apparatus having a plasma source, (a) a target is a metal oxide (M) or a metal (K) that constitutes the metal oxide (M).

(b) a gas supplied to the vacuum chamber is a rare gas or a rare gas and an oxygen gas.

(c) a gas pressure in the vacuum chamber is 4 to 6 pascals, in such a way that a thin film and columnar films consisting of the metal oxide (M) are deposited on the surface portion (S) and in space portions (Cn) formed in an upward direction from the bottom portions of the holes (Hn), respectively.

(10) The method for manufacturing the antireflection structure in the above paragraph 9, wherein a thickness (tn) of the columnar metal oxide film deposited in each of the space portions (Cn) of the substrate (B) increases as the depth (dn) of each of holes (Hn) become larger, so that differences in depth (fn) between the respective holes (Hn) from an uppermost surface portion (Sm) of the thin film deposited on the surface portion (S) to a surface portion of the metal oxide film in the space portion (Cn) are reduced.

(11) The method for manufacturing the antireflection structure in the above paragraph 9 or 10, wherein the vacuum film deposition apparatus having a plasma source is a sputtering apparatus.

(12) The method for manufacturing the antireflection structure in any of above paragraphs (9) to (11), wherein the metal oxide (M) forming the metal oxide film is any one of silicon oxide, aluminum oxide, titanium oxide and zirconium oxide.

(13) The method for manufacturing the antireflection structure in any of above paragraphs (9) to (12), wherein the target is the metal oxide (M) constituted of silicon oxide, aluminum oxide, titanium oxide or zirconium oxide, or the metal (K) constituted of silicon (Si), aluminum (Al), titanium (Ti) or zirconium (Zr).

(14) The method for manufacturing the antireflection structure in any of above paragraphs (9) to (13), wherein the gas supplied to the vacuum chamber is an argon gas or an argon gas and an oxygen gas.

(15) The method for manufacturing the antireflection structure in any of above paragraphs (9) to (14), wherein a thickness (p) of the thin film made of metal oxide (M) deposited on the surface portion (S) is 20 nm to 60 nm.

(16) The method for manufacturing the antireflection structure in any of above paragraphs (9) to (15), wherein when the thin film made of the metal oxide (M) having the thickness (p) of 20 nm to 40 nm is deposited on the surface portion (S) of the substrate (B) by using the vacuum film deposition apparatus having the plasma source, the depth (fn (nm)) of each hole (Hn) from the uppermost surface portion (Sm) of the substrate (B) to the surface portion of the metal oxide film deposited in the space portion (Cn) formed in the upward direction from the bottom portion of each hole (Hn) falls within the range represented by the following formula (i):

$$fn=[(0.195dn+95.5)+(p-25)]\times 0.90 \text{ to } [(0.195dn+95.5)+(p-25)]\times 1.10 \quad (i)$$

wherein the depth of each hole (Hn) from the surface portion (S) is represented by (dn (nm)) and the thickness of the metal oxide film deposited on the surface portion (S) is represented by (p (nm)), so that differences in depth (fn) between the respective holes (Hn) are reduced.

(17) The method for manufacturing the antireflection structure in any of above paragraphs (9) to (15), wherein when the thin film made of the metal oxide (M) having the thickness (p) of 20 nm to 40 nm is deposited on the surface portion (S) of the substrate (B) by using the vacuum film deposition apparatus having the plasma source, the depth (fn (nm)) of each hole (Hn) from the uppermost surface portion (Sm) of the substrate (B) to the surface portion of the metal oxide film deposited in the space portion (Cn) formed in the upward direction from the bottom portion of each hole (Hn) falls within the range represented by the following formula (ii):

$$fn=[(0.195dn+95.5)+(p-25)]\times 0.95 \text{ to } [(0.195dn+95.5)+(p-25)]\times 1.05 \quad (ii)$$

wherein the depth of each hole (Hn) from the surface portion (S) is represented by (dn (nm)) and the thickness of the metal oxide film deposited on the surface portion (S) is represented by (p (nm)), so that differences in depth (fn) between the respective holes (Hn) are reduced.

In the antireflection structure of the present invention, since metal oxides having an antireflection function are formed, as a thin film and as columnar films, on the surface portion (S) of the substrate (B) and in the space portions (Cn) from the bottom to the top of a plurality of nanometer-sized holes (Hn) having a depth (dn) and provided in the surface portion (S), respectively, the antireflection structure has an excellent antireflection effect and hydrophilic properties. And, since the thickness (tn) of each columnar film placed in the space portion (Cn) of each hole (Hn) is arranged to be increased as the depth (dn) of each hole (Hn) in the substrate (B) becomes larger, differences in depth (fn) between the respective holes (Hn) from the uppermost surface portion (Sm) of the substrate (B) decrease and, as a result, the antireflection structure exhibits a remarkable antireflection effect.

In addition, according to the method of manufacturing the antireflection structure of the present invention, by performing vacuum deposition on the substrate (B) provided with multiple nanometer-sized holes (Hn) under specific conditions using a vacuum film deposition apparatus having a plasma source, the surface portion (S) thereof and the space portion (Cn) in the upper direction from the bottom of each hole (Hn) are deposited, with a thin film and columnar films consisting of metal oxides (M) with antireflection functions respectively, and, as a result, the antireflection structure has excellent antireflection effects and hydrophilic properties.

In addition, in the antireflection structure obtained by the manufacturing method of the present invention, the thickness (tn) of each columnar film deposited in the space portion (Cn) of each hole (Hn) increases as the depth (dn) before deposition of each hole (Hn) in the substrate (B) becomes larger, so that differences in depth (fn) between the respective holes (Hn) from the uppermost surface portion (Sm) of the substrate (B) decrease, and as a result, the obtained antireflection structure exhibits a remarkable antireflection effect.

Hereinafter, the metal oxide (M) may be simply referred to as "metal oxide".

BRIEF DESCRIPTION OF THE DRAWINGS

(In FIG. 4, specimen (A-2), specimen (B-2), and specimen (C-5) are referred to as specimen (A), specimen (B), and specimen (C), respectively.)

(In FIG. 5, specimen (A-2) is referred to as specimen (A).)

(In FIG. 6, specimen (B-2) is referred to as specimen (B).)

(In FIG. 7, specimen (C-5) is referred to as specimen (C).)

(In FIG. 8, the specimen (A-2) is referred to as specimen (A).)

(In FIG. 9, specimen (B-2) is referred to as specimen (B).)

(In FIG. 10, specimen (C-5) is referred to as specimen (C).)

DETAILED DESCRIPTION OF PREFERRED EMBODIMENTS

The present invention will be described below as [1] the antireflection structure and [2] the method for manufacturing an antireflection structure, separately.

Figure 1:
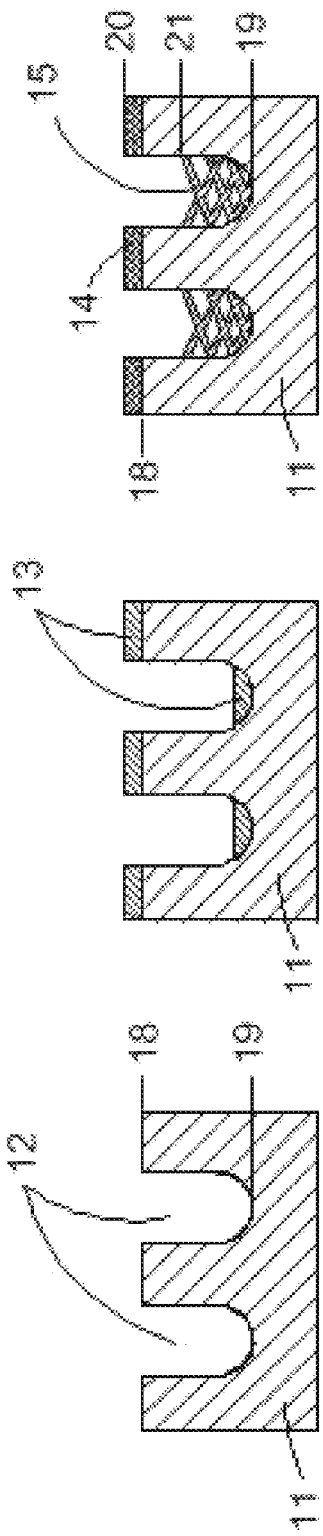
FIG. 1(a) is a conceptual diagram of a substrate (B) 11 provided with a plurality of nanometer-sized holes (Hn) 12.
FIG. 1(b) is a conceptual diagram of a known antireflection structure in which metal oxide films are placed on the surface portion of the substrate (B) and inside the holes thereof.
FIG. 1(c) is a conceptual diagram of a antireflection structure of the present invention in which thin films 14 and columnar films 15 made of metal oxide are disposed on a surface portion (S) of the substrate (B) 11 and in a space portion (Cn) of each hole (Hn) 12 thereof, respectively.

In FIGS. 1(a) to 1(c), 1(a) is the conceptual view of the substrate (B) 11 with holes 12 having a U-shaped cross-sectional shape in a direction perpendicular to the surface portion, and 1(b) is the conceptual view of a structure in which the thin film 13 is placed on the surface portion and holes of the substrate (B) 11 by a known method. 1(c) is the conceptual diagram of the antireflection structure in which the thin film 14 made of metal oxide is disposed on the surface portion (S) of the substrate (B) 11, and the columnar film 15 made of metal oxide is disposed in the space portion (Cn) of each hole (Hn) 12.

Figure 2:
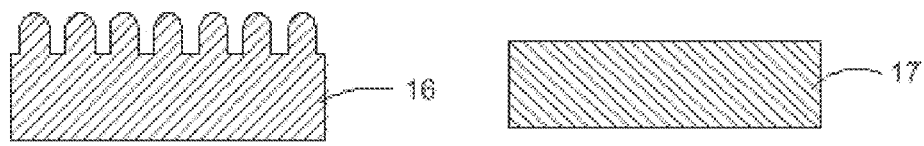
FIGS. 2(a) to 2(c) are conceptual diagrams showing the process of manufacturing the substrate (B) and the process of manufacturing the antireflection structure 10 from the substrate (B). 2(a) is the conceptual diagram of the upper mold 16 and the lower mold 17 for injection molding, 2(b) is the conceptual diagram of the injection molding process in which molten resin to form the substrate (B) 11 is injected into the space where these molds are set in the injection molding machine, and 2(c) is the conceptual diagram of the process of depositing the thin film 14 on the surface portion (S) of the substrate (B) 11 formed by the above injection molding process and depositing the columnar film 15 in the space portion (Cn) of each hole (Hn) formed in the substrate (B) by the vacuum film deposition process of this invention.
Figure 2:
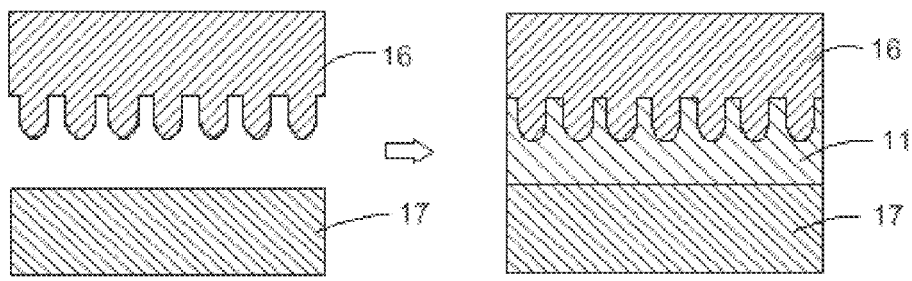
Figure 2:
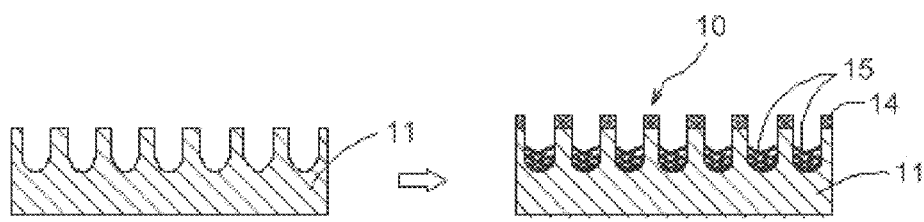

FIGS. 2(a) to 2(c) are conceptual diagrams showing the process of manufacturing the substrate (B) and the process of manufacturing the antireflection structure from the substrate (B). 2(a) is the conceptual diagram of the upper mold 16 and the lower mold 17 for injection molding, 2(b) is the conceptual diagram of the injection molding process in which molten resin to form the substrate (B) 11 is injected into the space where these molds are set in the injection molding machine, and 2(c) is the conceptual diagram of the process of depositing the thin film 14 on the surface portion (S) of the substrate (B) 11 formed by the above injection molding process and depositing the columnar film 15 in the space portion (Cn) of each hole (Hn) formed in the substrate (B) by the vacuum film deposition process of this invention.

FIGS. 3(a) to (c) are the SEM images of the specimen (A-2), specimen (B-2), and specimen (C-5) obtained in Reference Example 1, Example 1, and Comparative Example 2, respectively, observed from the upper side of the surface.

Figure 4:
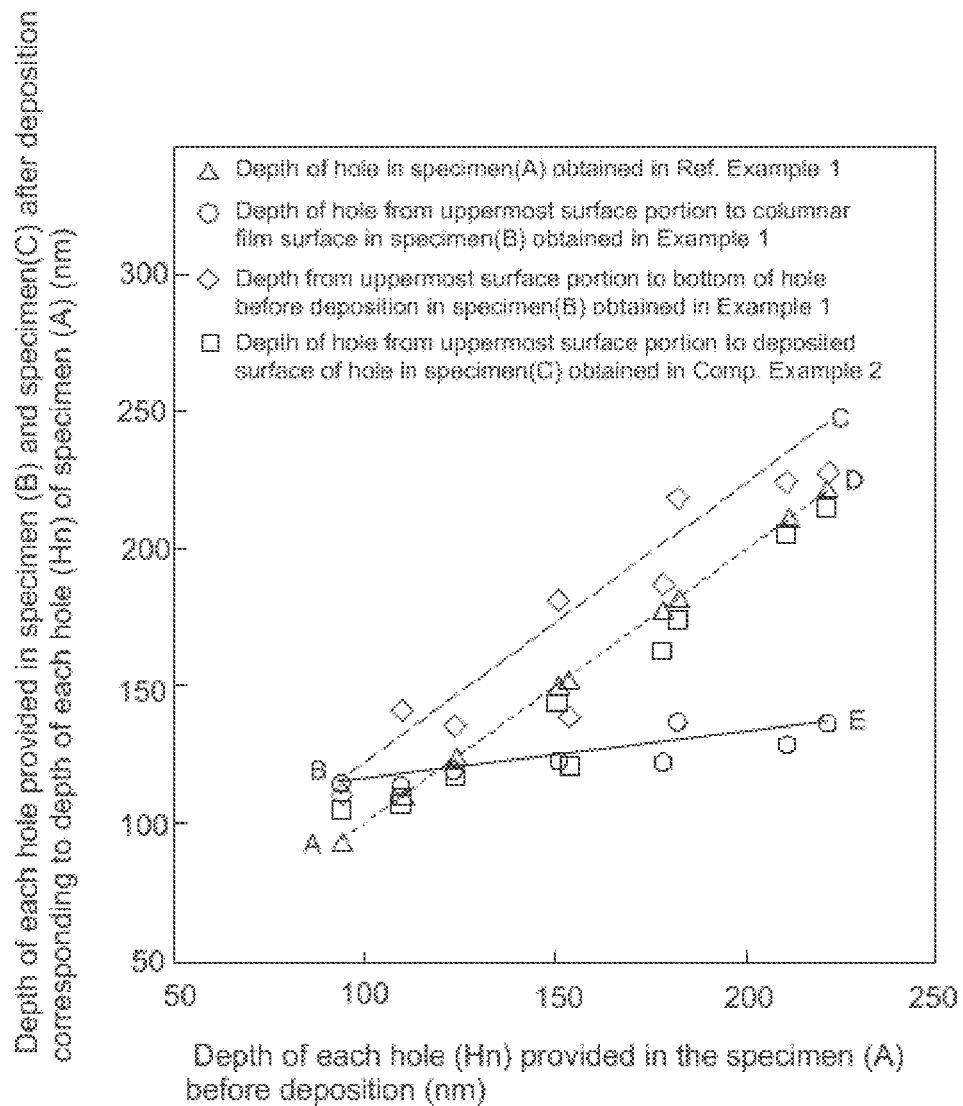
FIG. 4 is a graph showing the depth of each hole of the specimen (B-2) obtained by the process of the present invention and the specimen (C-5) obtained by the known process after deposition, corresponding to the depth of each hole (Hn) provided in the specimen (A-2) before deposition.

FIG. 4 shows the measurement results of the depth (fn) of each hole in the specimen (B-2) after deposition obtained by the process of the present invention, and in the specimen (C-5) after deposition obtained by a known process, corresponding to the depth (dn) of each hole (Hn) provided in the specimen (A-2) in Example 3 and Comparative Example 3 herein.

Figure 5:
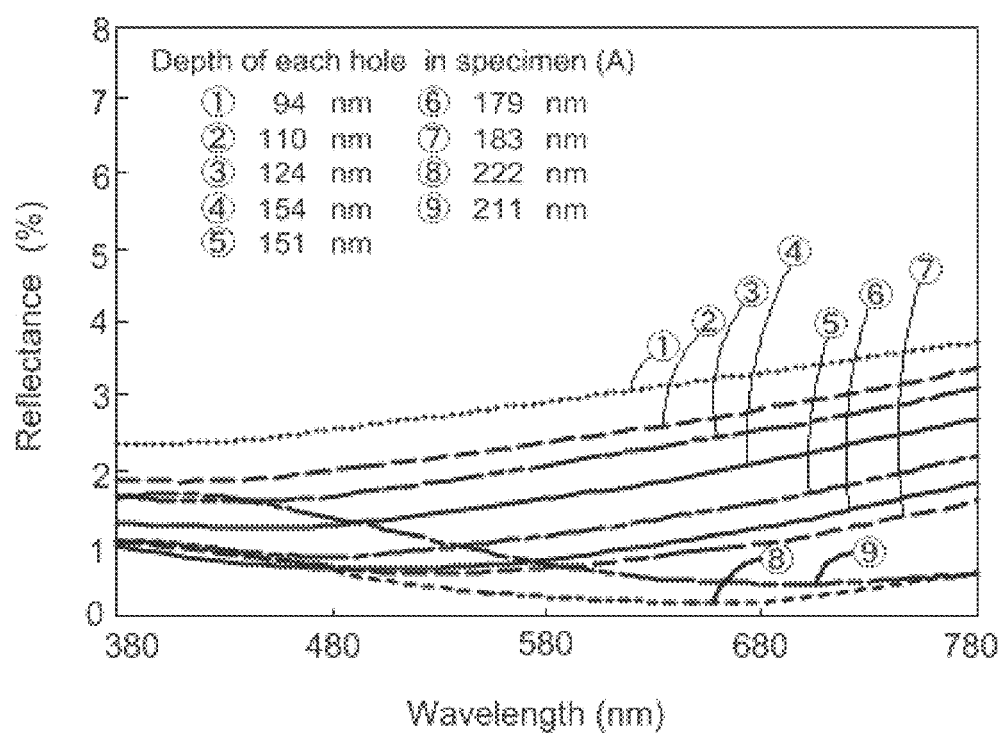
FIG. 5 shows a graph of the optical properties (relationship between the wavelength of incident light and the reflectance of incident light at the depth (dn) of each hole (Hn)) of the specimen (A-2) obtained in Reference Example 1 before deposition.
Figure 6:
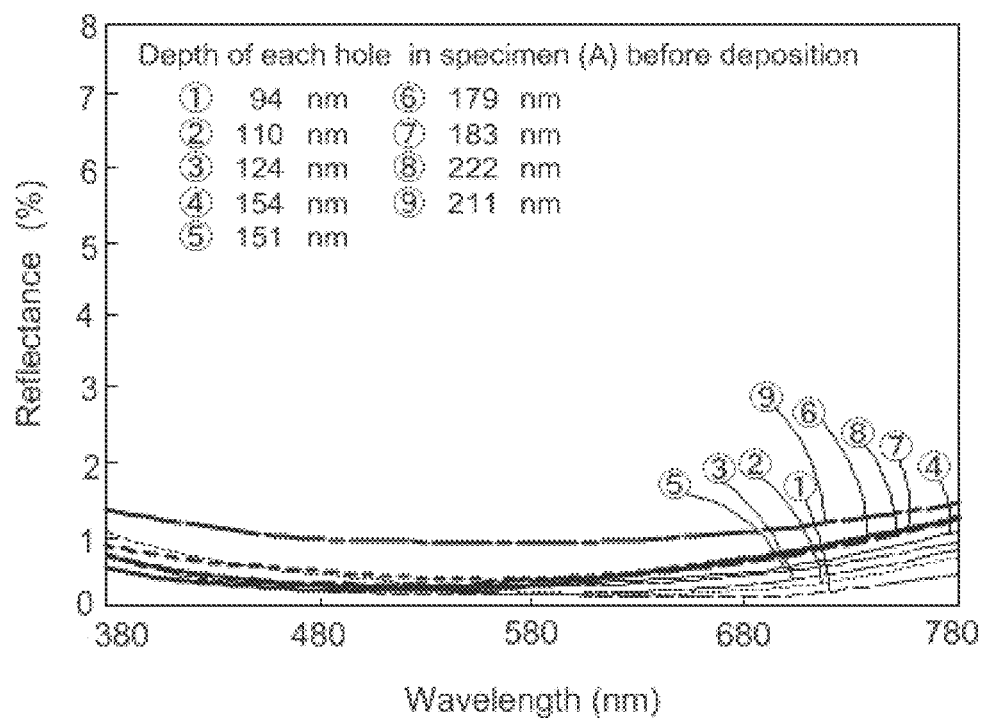
FIG. 6 shows a graph of the optical properties (relationship between the wavelength of incident light and the reflectance of incident light after deposition, in each hole (Hn) before deposition) of the specimen (B-2) obtained in Example 1 after deposition.
Figure 7:
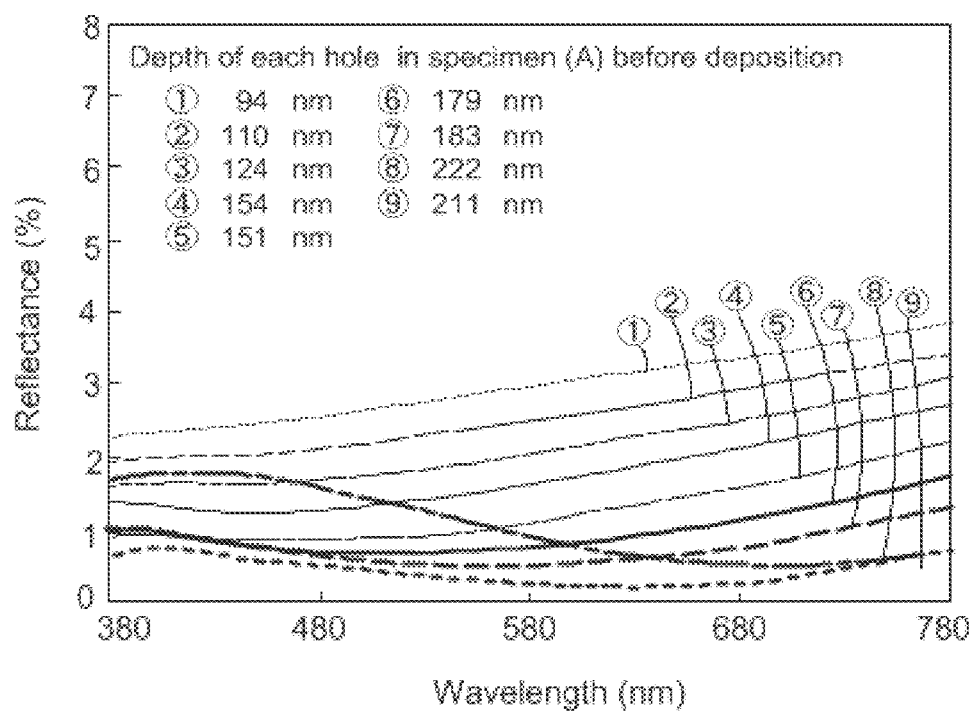
FIG. 7 shows a graph of the optical properties (relationship between the wavelength of incident light and the reflectance of incident light after deposition, in each hole (Hn) before deposition) of the specimen (C-5) obtained in Comparative Example 1 after deposition.

FIGS. 5 to 7 are diagrams illustrating the optical properties (relationship between the wavelength of incident light and reflectance of incident light) of the specimens (A-2), (B-2), and (C-5) obtained in Reference Example 1, Example 1, and Comparative Example 2 respectively above when an angle of incident light is 5 degrees.

Figure 8:
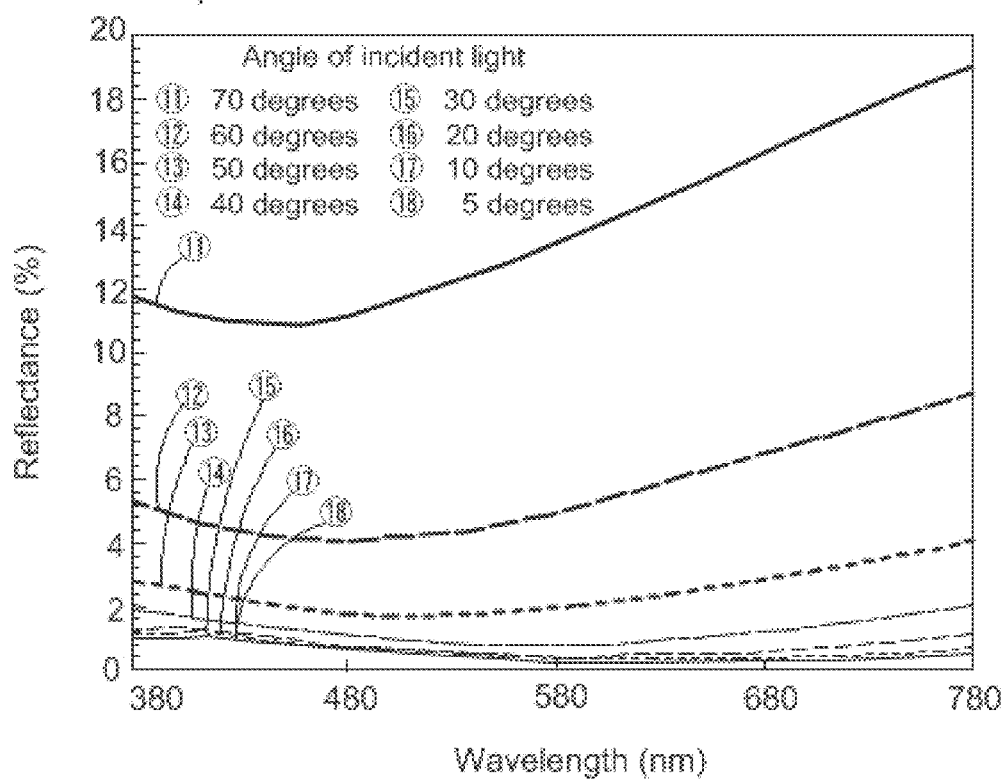
FIG. 8 shows a graph of the optical properties (relationship between the wavelength of incident light and the reflectance of incident light when the angle of incident light is changed within a range of 5 degrees to 70 degrees) of the specimen (A-2) obtained in Reference Example 1 before deposition.
Figure 9:
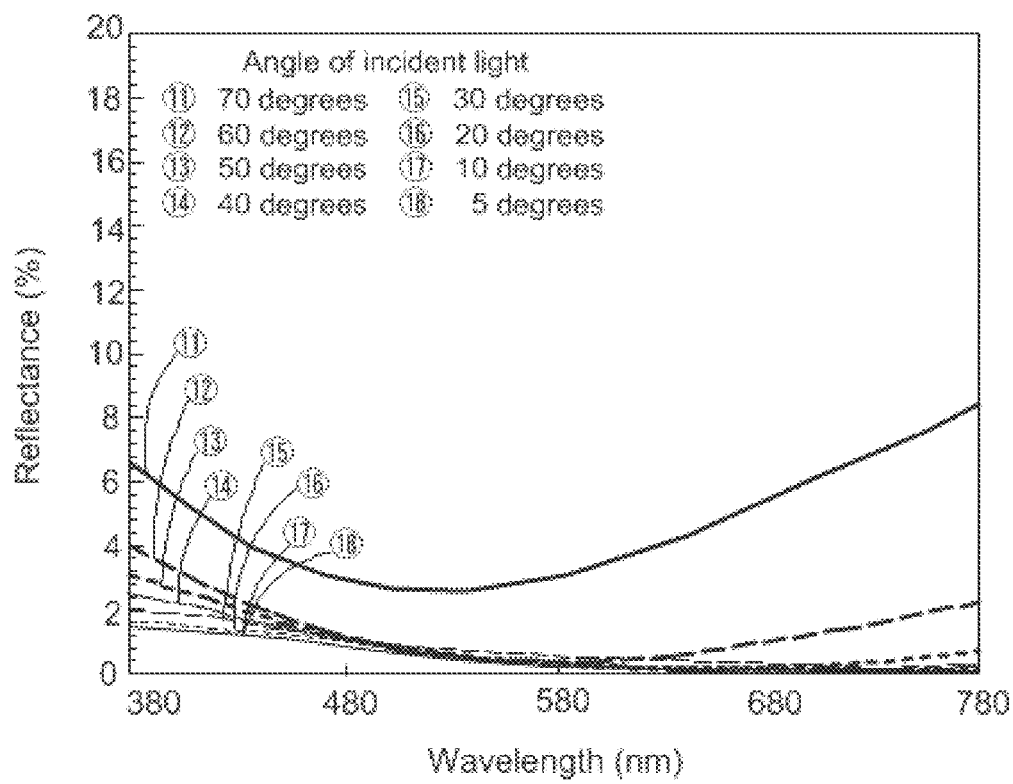
FIG. 9 shows a graph of the optical properties (relationship between the wavelength of incident light and the reflectance of incident light when the angle of incident light is changed within a range of 5 degrees to 70 degrees) of the specimen (B-2) obtained in Example 1 after deposition.
Figure 10:
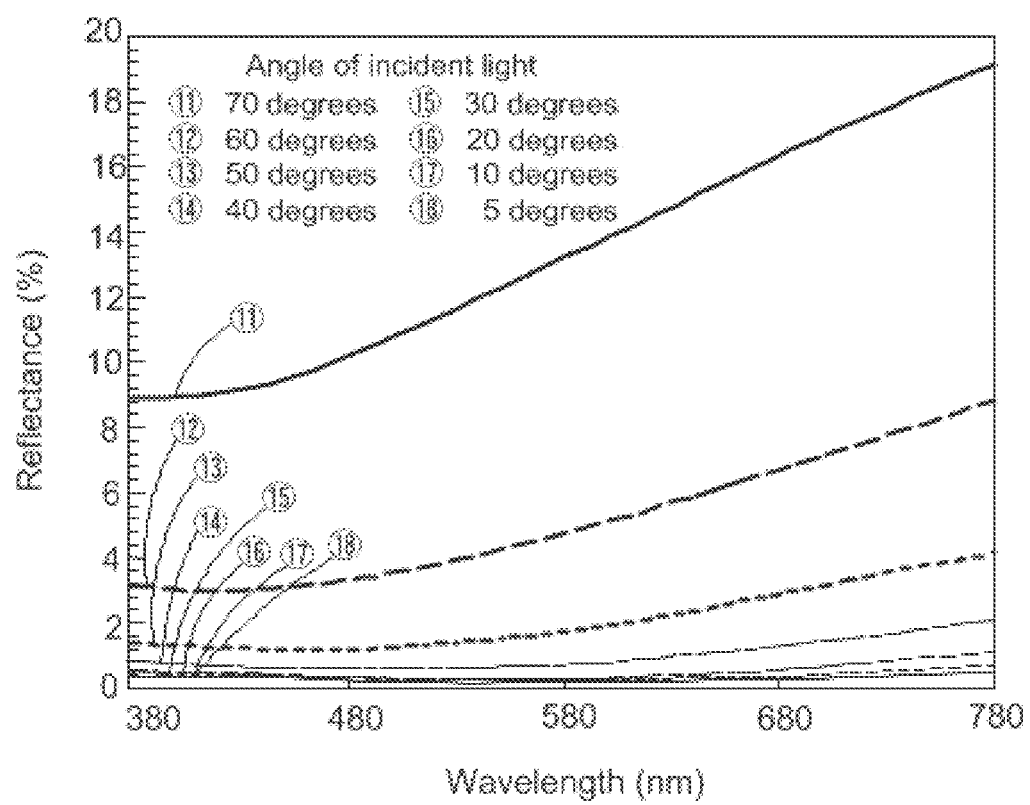
FIG. 10 shows a graph of the optical properties (relationship between the wavelength of incident light and the reflectance of incident light when the angle of incident light is changed within a range of 5 degrees to 70 degrees) of the specimen (C) obtained in Comparative Example 2 after deposition.

FIGS. 8 to 10 are diagrams illustrating the optical properties (relationship between the wavelength of incident light and reflectance of incident light) of the specimens (A-2), (B-2), and (C-5) obtained in Reference Example 1, Example 1, and Comparative Example 2 respectively above at each angle of incidence of light within the range of 5 degrees to 70 degrees. FIGS. 3 to 10 will be described in examples and comparative examples herein.

[1] Antireflection Structure

The features of the antireflection structure of the present invention are as follows.

That is, the antireflection structure comprises a transparent substrate (B) having a plurality of holes (Hn) with U-shaped or V-shaped cross-sectional shapes in a direction perpendicular to a flat surface portion thereof, and a metal oxide film disposed on the surface portion (S) of the transparent substrate (B) and in space portions (Cn) formed in an upward direction from bottom portions of the holes (Hn) of the transparent substrate (B), wherein each of the holes (Hn) has a geometry in which an average diameter (m) of openings of the holes (Hn) is 50 nm to 300 nm, an average distance (k) between the center points of the openings of adjacent holes (Hn) is 100 nm to 400 nm, and a depth (dn) of each hole (Hn) from the surface portion (S) of the substrate (B) is 80 nm to 250 nm;

and wherein a thickness (tn) of the metal oxide film disposed in each of the space portions (Cn) increases as the depth (dn) of each of the holes (Hn) becomes larger, so that differences in depth (fn) between the respective holes (Hn) from an uppermost surface portion (Sm) of the metal oxide film disposed on the surface portion (S) to a surface portion of the metal oxide film in the space portion (Cn) are reduced.

(1) Substrate (B)

The substrate (B) is a transparent structure in which a plurality of holes (Hn), each with a U-shaped or V-shaped cross-sectional shape in a direction perpendicular to the flat surface portion, are formed, and the geometry of each hole (Hn) is such that an average diameter of the openings (m) is 50 nm to 300 nm, an average distance (k) between the center points of openings of adjacent holes (Hn) is 100 nm to 400 nm, and an depth (dn) of each hole (Hn) from the surface portion (S) of the substrate (B) is 80 nm to 250 nm.

(1-1) Material of Substrate (B)

As an organic material usable for the substrate (B), polycarbonate resin, polyacrylic resin, polyamide resin, polyester resin, polyolefin resin, polycycloolefin resin, polyurethane resin, cellulose resin, polyvinyl chloride resin, polyether resin, polyarylate resin and others can be used, but not limited thereto. And as an inorganic material usable for the substrate (B), glass, silicon, quartz, ceramic material and others can be used, but not limited thereto. Among the above materials, the use of organic materials is preferable in consideration of the processability in forming holes (Hn).

The polycarbonate is more preferable because of its excellent transparency, impact resistance, heat resistance, dimensional stability and self-digestibility, and polyethylene terephthalate is more preferable because of its excellent heat resistance, mechanical strength, dimensional stability, chemical resistance, optical properties, etc., as well as surface smoothness and handling properties.

(1-2) Structure of the Substrate (B)

The surface portion of the substrate (B) is flat, and its surface roughness is preferably 50 nm or less in terms of arithmetic mean roughness (Ra) based on JIS 601. The flat shape also includes a curved shape with a gentle curvature. There is no restriction on the thickness of the substrate (B).

The geometry of each hole (Hn) provided on the surface portion (S) of the substrate (B) is the U-shaped or V-shaped cross-sectional structure in the direction perpendicular to the surface portion, as shown in the conceptual diagram in FIG. 1(a) or the like. By adopting such a shape, it is easy to form the columnar films made of metal oxide in the space portions (Cn) of the holes (Hn) to be described later, and an antireflection effect against light is improved.

The average diameter (m) of the opening of each hole (Hn) provided on the surface portion (S) of the substrate (B) is 50 nm to 300 nm, preferably 80 nm to 300 nm, in consideration of the antireflection effect of visible light. The average distance (k) between the center points of openings of the adjacent holes (Hn) is 100 nm to 400 nm, preferably 100 nm to 350 nm, from the viewpoint of the antireflection effect of the light.

The area ratio (r) of the openings (aperture ratio) of the holes (Hn) in the surface portion (S) of the substrate (B) is preferably 50 to 80 area %. The depth (dn) of each hole (Hn) from the surface portion (S) of the substrate (B) is 80 nm to 250 nm in consideration of the antireflection function and the placement of the thin film described later, and is preferably 90 nm to 230 nm when the refractive index of the substrate (B) is 1.46.

The average diameter (m) of the opening of each hole (Hn) and the average distance (k) between the center points of openings of the adjacent holes (Hn) are the median values obtained from the normal distribution of the measured values, and the range of the depth (dn) of each hole (Hn) above should include 70% or more of the measured values if there is some variation.

The structure of the above substrate (B) can be formed by using an upper mold 16 for injection molding and a lower mold 17 for injection molding shown in FIG. 2(a), and by adopting a process of injecting the molten resin which forms the substrate (B) into the space in which these molds are set in the injection molding machine shown in FIG. 2(b). In addition to injection molding, it can be formed by casting, press molding, etc. using the mold composed of nanostructures.

(2) Antireflection Structure with Metal Oxide Film Disposed on the Substrate (B)

In this antireflection structure of the present invention, metal oxide is disposed as the thin film on the surface portion (S) of the transparent substrate (B), and metal oxide is disposed as the columnar film in the space portion (Cn) of each hole (Hn).

Conventionally, as a means for providing antireflection function to the substrate, a structure in which an antireflection film made of metal oxide was placed in nanometer-sized holes below the wavelength of the light source that prevent reflection on the surface of the substrate was known. However, when there is a variation in the depth of holes formed in the substrate, even if the metal oxide film having the same thickness is disposed on the surface portion and in the space portion of each hole in the substrate, it is not always possible to exhibit a sufficient antireflection effect.

One of the features of the antireflection structure of the present invention is that as shown in FIG. 1(c), a thin film made of metal oxide is disposed on the surface portion (S) of the structure, and columnar film made of the same metal oxide is disposed in the space portion (Cn) of each hole (Hn), which is in a different structure from the aforementioned thin film, to perform the antireflection function.

A further feature of the present invention is that a thickness (tn) of the columnar film made of the metal oxide and formed in the space portion (Cn) of each hole (Hn) increases as the depth (dn) of each the holes (Hn) before deposition becomes larger, as described below, so that differences in depth (fn) after deposition between the respective holes (Hn) are reduced, thereby further improving the antireflection function.

(2-1) Metal Oxide Film

Specific examples of inorganic metal oxides (M) that are placed on the surface portion (S) and in the space portion (Cn) of each hole (Hn) in the substrate (B) and that form metal oxide films capable of performing antireflection effects include silicon oxide, aluminum oxide (alumina), zirconium silicate, rutile-type titanium oxide, tin oxide, zirconium oxide, cerium oxide, zinc oxide, iron oxide, antimony oxide, niobium pentoxide, and copper oxide. Among these, silicon oxide, aluminum oxide, titanium oxide, and zirconium oxide (zirconia) with a low refractive index are preferred.

(2-2) Metal Oxide Thin Film Disposed on the Surface Portion (S) of the Substrate (B)

The thickness (p) of the thin film of metal oxide film disposed on the surface portion (S) of the substrate (B) is preferably 20 nm to 60 nm, and 20 nm to 40 nm is more preferable, considering the thickness (tn) of the columnar film disposed in the space portion (Cn) of each hole (Hn) and the antireflection function, etc.

When the thickness (p) of the thin film made of a metal oxide disposed on the surface portion (S) of the above antireflection structure is on the order of several tens of nanometers, it is judged that the orientation is not high and the density is relatively high, in view of, for example, FIG. 3(b), which is a SEM image of the antireflection structure obtained in Example 1 herein, and the prior art and the like.

(2-3) Columnar Film of Metal Oxide Disposed in the Space Portion (Cn) of Each Hole (Hn) of the Substrate (B)

The structure of the columnar film of metal oxide disposed in the space portion (Cn) of each hole (Hn) of the substrate (B) is determined that it is oriented, fibrous and columnar as a whole from the results of, for example, FIG. 3(b) which is the SEM image of the antireflection structure obtained in Example 1 herein, and the Thornton model (see International Publication No. 2008-07190 6, and J. A. Thornton, J Vac. Sci. Technol. 11, p 666 1974).

In addition, in the space portion (Cn) of each hole (Hn), the columnar film is preferably disposed in the direction toward the bottom of the hole (Hn) from a position about 120 nm relative to the uppermost surface portion (Sm) of the thin film-bearing substrate (B) and is more preferably disposed through a depth of 120 to 250 nm. Preferred thickness (tn (nm)) of the columnar film is described later.

(2-4) Antireflection Structure

The antireflection structure of the present invention is characterized by the thin film 14 made of metal oxide disposed on the surface portion (S) 18 of the transparent substrate (B) 11 provided with a plurality of holes (Hn) 12 of the above specific nanometer size, and the columnar film 15 of the different structure from the above thin film disposed in the space portion (Cn) of each hole (Hn) 12, thereby the antireflection function is performed, and further, since the columnar film is fibrous, the antireflection effect, the hydrophilic effect, and the anti-fog effect are improved (reference should be made to FIGS. 1(a) and 1(c)). In addition, in a preferred embodiment of the present invention, the thickness (tn) of the columnar film 15 made of metal oxide formed in the space portions (Cn) of each of the holes (Hn) 12 increases as the depth (dn (nm)) from the surface portion (S) 18 to the bottom portion 19 of the holes (Hn) 12, provided in the substrate (B) 11 becomes larger.

As a result, the difference in each depth (fn) from the uppermost surface portion (Sm) 20 of the substrate (B) 11 to the surface portion 21 of the metal oxide film disposed in the space portion (Cn) of each hole (Hn) 12 is reduced as shown in Equation (i) or Equation (ii) below, thereby further improving the antireflection function.

From the results of Example 3 herein, when the thickness (p) of the thin film disposed on the surface portion (S) of the substrate (B) is 25 nm, each depth (fn (nm)) from the uppermost surface portion (Sm) of the substrate (B) to the surface portion of the metal oxide film in the space portion (Cn) of each hole (Hn) can be obtained from the following equation (iii), as described later.

$$fn = 0.195dn + 95.5 \quad \text{(iii)}$$

The thickness (tn (nm)) of each columnar film formed in each space portion (Cn) can be obtained from the following equation (iv).

$$tn = (dn + p) - fn \quad \text{(iv)}$$

Since the tilt value (0.195) in the above equation (iii) is relatively small, the thickness (p) of the thin film placed on the surface portion (S) of the substrate (B) can be generalized to a range of 20 nm to 40 nm, and a preferable range of each depth (fn) from the uppermost surface portion (Sm) of the substrate (B) to the surface portions of the columnar film in the space portions (Cn) of the holes (Hn) can be determined.

When the thickness (p) of the thin film disposed on the surface portion (S) of the substrate (B) is 20 nm to 40 nm, preferably 20 nm to 30 nm, and when the depth (dn) of each hole (Hn) of the substrate (B) is 80 nm to 250 nm, the depth (fn (nm)) of each hole (Hn) from the uppermost surface portion (Sm) of the substrate (B) to the surface portion of the metal oxide film disposed in the space portion (Cn) of the hole (Hn) is preferably in the range indicated by the following formula (i), which is calculated from the depth (dn (nm)) of each hole (Hn) before film disposition relative to the surface portion (S).

$$fn = [(0.195dn + 95.5) + (p - 25)] \times 0.90 \text{ to } [(0.195dn + 95.5) + (p - 25)] \times 1.10 \quad \text{(i)}$$

Incidentally, in formula (i), (p−25) takes into consideration that the thickness (p) of the thin film disposed on the surface portion of the substrate (B) is within the above range, and the coefficients 0.90 and 1.10 are numerical values for indicating the upper limit and the lower limit of the depth (fn) in consideration of the range of variation in FIG. 4, and the unit of the numeral is a nanometer (nm).

In the present invention, when 90% or more of the depths (fn) of all of the holes (Hn) are included in the range of the above formula (i), the effect of the present invention may be suitably performed.

When the thickness (p) of the thin film disposed on the surface portion (S) of the substrate (B) is 20 nm to 40 nm, preferably 20 nm to 30 nm, and when the depth (dn) of each hole (Hn) of the substrate (B) is 80 nm to 250 nm, the depth (fn (nm)) of each hole (Hn) from the uppermost surface portion (Sm) of the substrate (B) to the surface portion of the metal oxide film placed in the space portion (Cn) of each hole (Hn) is more preferably in the range shown in the following formula (ii), which is obtained from the depth (dn (nm)) of each hole (Hn) before deposition relative to the surface portion (S).

$$fn = [(0.195dn + 95.5) + (p - 25)] \times 0.95 \text{ to } [(0.195dn + 95.5) + (p - 25)] \times 1.05 \quad \text{(ii)}$$

Incidentally, in formula (ii), (p−25) takes into consideration that the thickness (p) of the thin film disposed on the surface portion of the substrate (B) is within the above range, and the coefficients 0.95 and 1.05 are numerical values for indicating the upper limit and the lower limit of the depth (fn) in consideration of the range of variation in FIG. 4, and the unit of the numeral is a nanometer (nm).

In the present invention, when 90% or more of the depths (fn) of all of the holes (Hn) are included in the range of the above formula (ii), the effect of the present invention may be suitably performed.

The antireflection structure of the present invention can be manufactured, for example, by using a vacuum film deposition apparatus, such as a sputtering apparatus or the a vapor deposition apparatus described below, when the thin film and the columnar film made of the metal oxide are disposed on the surface portion (S) of the substrate (B) and in the space portion (Cn) of each hole (Hn), respectively. In this case, a gas pressure in a vacuum chamber is made relatively higher than usual to shorten the mean free path of particles and to enhance the scattering effect.

In addition, it is also possible to manufacture the antireflection structure of the present invention by shortening the mean free path of particles than usual and enhancing the scattering effect, even when vacuum deposition equipment such as a vapor deposition equipment is combined with a plasma source using ion beams or high frequency, etc., to increase the particle energy in a complex manner.

In the antireflective structure of the present invention, it is possible to reduce the light reflectance to 2% or less for a specific visible light range, as shown in FIG. 6.

In the antireflection structure of the present invention, the thin film made of metal oxide is disposed on the surface portion (S) of the substrate (B) provided with a plurality of holes (Hn) of the above specific nanometer size, and is also disposed in the space portion (Cn) of each hole (Hn) in the form of a fibrous columnar film which is in a different structure from the above thin film. As a result, it is possible to obtain a hydrophilic surface having higher hydrophilic effect and durability than the structure before the fibrous columnar film has been arranged in the space portion (Cn) of the hole (Hn).

It is presumed that the hydrophilicity is improved by the placement of the fibrous columnar film in the space portion (Cn) of each hole (Hn), because, based on the Wenzel's theory, the wetting surface becomes more wettable by increasing the surface area of the structure. Further, by disposing the thin film made of the metal oxide on the surface portion (S) of the substrate (B) provided with a plurality of nanometer-sized holes (Hn) and by disposing the fibrous columnar film having the structure different from that of the thin film in the space portion (Cn) of the hole (Hn), it is possible to enhance the anti-fogging effect as compared with a cast structure.

[2] Manufacturing Method of the Antireflection Structure

The manufacturing method of the antireflection structure of the present invention is one which includes depositing a metal oxide film on a transparent substrate (B) having a plurality of holes (Hn) with the U-shaped or V-shaped cross-sectional shape in a direction perpendicular to a flat surface portion thereof,
wherein each of the holes (Hn) having a geometry in which an average diameter (m) of the openings of the holes (Hn) is 50 nm to 300 nm, an average distance (k) between the center points of openings of the adjacent holes (Hn) is 100 nm to 400 nm and a depth (dn) of each of the holes (Hn) from the surface portion (S) is 80 nm to 250 nm, and wherein said depositing is by vacuum deposition that is carried out under the following conditions (a), (b), and (c) by using a vacuum film deposition apparatus having a plasma source,
(a) a target is a metal oxide (M) or a metal (K) that constitutes the metal oxide (M).
(b) a gas supplied to the vacuum chamber is a rare gas or a rare gas and an oxygen gas.
(c) a gas pressure in the vacuum chamber is 4 to 6 pascals, in such a way that a thin film and columnar films consisting of metal oxide (M) are deposited on the surface portion (S) and in the space portions (Cn) formed in the upward direction from the bottom portions of the holes (Hn), respectively.

The manufacturing method of the antireflection structure of the present invention is the method of depositing a thin film and a columnar film on a surface portion (S) of a transparent substrate (B) having a plurality of holes (Hn) of a specific nanometer size on the surface portion (S) and in a space portion (Cn) of each hole (Hn), respectively, using a vacuum film deposition apparatus such as sputtering with a plasma source.

The means of manufacturing above-mentioned substrate (B) with specific nanometer-sized holes (Hn) in the substrate can be carried out in a known manner, as described below. In general, a method of forming the film on a surface portion of a substrate or the like includes a wet method such as plating and anodic oxidation, and a dry method such as a physical method and a chemical method. The physical method (PVD, physical vapor deposition) includes vacuum evaporation, sputtering, ion plating, and the like.

In the manufacturing method of the antireflection structure of the present invention, when forming the film made of metal oxide on the substrate (B), a vacuum film deposition method such as sputtering and vacuum evaporation using plasma, which belongs to the above physical methods is adopted. The method is characterized in that the mean free path of particles such as metal oxide is made shorter than usual to enhance the scattering effect, so that the thin film which is made of the metal oxide and which is relatively dense and flat is formed on the surface portion (S), and the columnar films of the same material as the thin films deposited on the surface portion (S) are deposited in the space portions (Cn) of the holes (Hn).

The vacuum film forming method using a plasma source is widely used for coating and forming a thin film, and is widely used in a coating of a tool or the like and a semiconductor or a liquid crystal in addition to the formation of a functional film such as an optical element because of a wide range of selection of materials and ease of control.

Vacuum deposition methods, such as sputtering, are characterized by their ability to form thin films with a relatively dense and uniform structure even at low temperatures, excellent reproducibility and stability, the ability to reduce a size of the apparatus because a distance between the target and the substrate can be relatively short, and the ability to achieve continuous production because the target life is long.

Among the vacuum film deposition methods, sputtering is characterized by the fact that the energy of the particles emitted from the target into the vacuum is much higher than other physical methods such as vacuum evaporation, and the sputtering rate, which is the number of atoms (or molecules) ejected into the gas phase by sputtering per particle incident on the target, is low.

In addition, since the energy of the particles affects the structure and properties of the thin film to be formed, it is necessary to consider the selection of target material and sputtering gas, discharge conditions, pressure, and control conditions such as the distance between the target and substrate surfaces.

(1) Substrate (B)

(1-1) Material of Substrate (B)

There are no restrictions on the material of the substrate (B) on which the metal oxide film is formed by the vacuum film deposition method, and the film can be formed on basically any material. Organic materials such as plastics and inorganic materials such as glass, ceramics and metals can be used as the material.

As preferable organic materials for the substrate (B), polycarbonate resin, polyacrylic resin, polyamide resin, polyester resin, polyolefin resin, polycycloolefin resin, polyurethane resin, cellulose resin, polyvinyl chloride resin, polyether resin, and polyarylate resin, etc. are included, but are not limited thereto.

As preferable inorganic materials for the substrate (B), glass, silicon, quartz, and ceramic materials, etc. are included, but are not limited thereto. Among the above materials, the use of the organic materials is more preferable in consideration of processability such as the formation of holes (Hn).

The polycarbonate is more preferable because of its excellent transparency, impact resistance, heat resistance, dimensional stability, and self-digestibility, while polyethylene terephthalate is more preferable because of its excellent heat resistance, mechanical strength, dimensional stability, chemical resistance, optical properties, and the like, and smoothness and handling properties of the substrate surface.

(1-2) Structure of the Substrate (B)

The surface portion of the substrate (B) is flat, and its surface roughness is preferably 50 nm or less in terms of arithmetic mean roughness (Ra) based on JIS 601. The flat shape also includes a curved shape with a gentle curvature. There is no restriction on the thickness of the substrate (B). The geometry of each hole (Hn) provided on the surface portion (S) of the substrate (B) is U-shaped or V-shaped in the cross-sectional structure in a direction perpendicular to the surface portion, as shown in the conceptual diagram in FIG. 1(a). With such a shape, the antireflection effect on light is easily facilitated, and the metal oxide film is easily deposited as the columnar film in the space portion (Cn) of each hole (Hn) to be described later.

The average diameter (m) of the openings of the holes (Hn) in the surface portion (S) of the substrate (B) is 50 nm to 300 nm, preferably 80 nm to 300 nm, in considering of the antireflection effect of the lights, etc.

The average distance (k) between the center points of the openings of adjacent holes (Hn) is 100 nm to 400 nm, preferably 100 nm to 350 nm from the view point of the antireflection effect of light.

The ratio (aperture ratio) (r) of the openings portion of the holes (Hn) in the surface portion (S) of the substrate (B) is preferably 50 to 80 area %. The depth (dn) of each hole (Hn) from the surface portion (S) of the substrate (B) is 80 nm to 250 nm, considering the arrangement of the thin film on the surface portion (S), etc. When the refractive index of the substrate (B) is 1.46, the depth (dn) is preferably 90 nm to 230 nm.

The average diameter (m) of the openings of the holes (Hn) and the average distance (k) between the center points of the openings of the adjacent holes (Hn) are the median values obtained from the normal distribution of the measured values, and the above range of the depth (dn) of each hole (Hn) may include at least 70% of the measured values when there exists some variation.

The structure of above-mentioned substrate (B) can be formed by using an upper mold 16 for injection molding and a lower mold 17 for injection molding shown in FIG. 2(a) in a process in which a molten resin for forming the substrate (B) is injected into a space where these molds are set in the injection molding machine, as shown in FIG. 2(b), but in addition to injection molding using a mold composed of the nanostructure, it can be formed by casting molding, press molding, or the like.

When the shape of the substrate (B) has a complex three-dimensional structure, it is difficult to form a film while warping around the details thereof in vacuum deposition such as sputtering, and there may remain a surface on which no deposition occurs. In such a case, by shortening the mean free path of particles such as metal oxides, it is possible to scatter the particles in various directions, thereby increasing the amount of the wrap-around. However, there is a limit to this wrap-around, and it is difficult to reach the back surface, although it is possible to attach the particles to a right angle to the target.

(2) Manufacturing Conditions for the Antireflection Structure

In the manufacturing method of the antireflection structure of the present invention, an apparatus such as a sputtering apparatus can be used as a vacuum film deposition apparatus using a plasma source, which utilizes a physical method to form the film made of a metal oxide on the substrate (B). In addition, it is also possible to manufacture the antireflection structure of the present invention by using an apparatus in which the particle energy is increased in a complex manner by combining a vacuum film deposition apparatus such as a vapor deposition apparatus with a plasma source that uses an ion beam, a high frequency wave, or the like, in case where the mean free path of the particles is shortened to increase the scattering effect. A specific example of the manufacturing method of the present invention using the sputtering apparatus is described below.

(2-1) Sputtering Apparatus

(a) Sputtering

In sputtering, a high voltage is applied between the substrate (anode side) and the target (cathode side), while introducing an inert gas such as argon (Ar) into the vacuum chamber, to bombard the ionized rare gas such as argon onto the target, and thereby to deposit the target material that is flicked off on the substrate. The process is carried out in the vacuum in order to ionize the rare gas, to allow the target molecules dispersed by sputtering to reach the substrate, and to produce a film with few impurities.

The gas supply section can be equipped with gas nozzles in the longitudinal direction of the target, i.e. the width of the substrate. When supplying reactive gases such as oxygen gas, the feed rate thereof is selected as appropriate according to the composition of the thin film to be formed.

As a typical sputtering apparatus system in view of the discharge and plasma to be utilized, there may be mentioned a magnetron system, an ion beam system, a DC 2 pole system, an alternating 2 pole system and the like, and among these systems, the magnetron system having a large film formation rate is preferable, and is widely used in practice.

(b) Magnetron Sputtering Method

The most common method to obtain particles with high energy to cause sputtering is to generate plasma and electrically accelerate the formed ions. Furthermore, a magnetic field can be used to confine the plasma and increase the efficiency of the use of electrons. This method is called the magnetron sputtering method. The magnetron sputtering method is one in which a permanent magnet is placed on the back of the cathode to increase the sputtering rate.

The magnetron sputtering method can improve the deposition rate of the target material on the substrate by incorporating the magnetic field generator on the back of the target. In this method, a glow discharge is generated by applying a voltage between the anode and the cathode to ionize the inert gas in the vacuum chamber, while the secondary electrons emitted from the target are captured by the magnetic field formed by the magnetic field generator and cause a cycloidal motion on the target surface.

As a result, since the ionization of argon molecules or the like is accelerated by a cycloidal motion of an electron, the film formation rate increases and an adhesion strength of the film increases.

(2-2) Target

Materials such as metals (K) and metal oxides (M) can be used as targets. Specifically, metal oxides (M) such as silicon oxide, aluminum oxide (alumina), zirconium silicate, rutile-type titanium oxide, tin oxide, zirconium oxide, cerium oxide, zinc oxide, iron oxide, antimony oxide, niobium pentoxide, copper oxide, or the like, or metals (K) such as silicon, aluminum, titanium, tin, zirconium, cerium, zinc, iron, antimony, niobium, or copper, or the like can be used. When forming the film of a compound consisting of silicon oxide, silicon oxide can be used as the target, or silicon metal can be used to form a silicon oxide film by introducing oxygen gas into the vacuum chamber and compounding the metal with oxygen. The latter is known as reactive sputtering.

(2-3) Sputtered Film

Specific examples of inorganic metal oxides (M) that can be deposited on the surface portion (S) of the substrate (B) and in the space portion (Cn) of each hole (Hn) to exhibit antireflection effects include silicon oxide, aluminum oxide (alumina), zirconium silicate, rutile-type titanium oxide, tin oxide, zirconium oxide, cerium oxide, zinc oxide, iron oxide, antimony oxide, niobium pentoxide, and copper oxide etc. Among these, silicon oxide, aluminum oxide, other titanium oxides, and zirconium oxide (zirconia) with low refractive index are preferred.

(2-4) Sputtering Conditions

Factors for sputtering conditions include (a) power supply and voltage, (b) sputtering gas, (c) gas pressure, (d) face spacing between substrate and target, and (e) sputtering temperature and time.

(a) Power Supply and Voltage

Either a DC power supply or a high-frequency power supply can be used as the power supply for sputtering. High-frequency sputtering (RF sputtering) is sputtering that uses the high-frequency power supply as the power source, making it possible to use insulators as they are for targets when forming films of insulators.

The method of applying voltage for sputtering between the cathode and anode is not particularly limited, and includes the following methods: a method of applying an AC voltage between 2 targets, a method of applying a voltage to a single target by a DC pulse power supply, and a so-called bipolar DMS method of applying a voltage to 2 targets by the DC pulse power supply alternately.

For example, when the AC voltage is applied to the pair of targets, each target is alternately switched to anode and cathode electrodes, generating a glow discharge between the anode and cathode electrodes to form a plasma atmosphere.

(b) Gas for Sputtering

In sputtering, argon, which is a rare gas, is usually used for the discharge, but other rare gases can be used. When a metal such as silicon is used as the target material and a compound film such as silicon oxide is deposited by reactive sputtering, a reactive gas such as oxygen gas can be used in addition to the rare gas. Also, in order to form a thin film with a stoichiometric composition ratio of Si and O (oxygen) of 1 to 2, using a compound such as silicon oxide or other metal oxides for the target, it becomes necessary to add oxygen gas in the discharge gas, which is also the form of reactive sputtering. A gas flow control device is usually used to introduce these gases into the vacuum chamber.

When reactive sputtering using silicon as the metal target is used to deposit dielectric thin film such as silicon oxide, oxide thin films may be deposited by introducing rare gases such as argon and reactive gases such as oxygen into the sputter chamber, and controlling the amount of reactive gas introduced so as to create a transition region which is between the metal and oxide regions. When an oxygen gas is used together with a rare gas as the sputtering gas, the concentration of the oxygen gas in the gas may be 15 to 35 mole %, depending on the experimental conditions.

(c) Gas Pressure

In the manufacturing method of the antireflection structure of the present invention, the substrate (B) is provided with a plurality of nanometer-sized holes (Hn) as described above, and the gas pressure in the vacuum chamber is set at a pressure relatively higher than the usual 0.5 to 1 Pascals (Pa). In other words, the sputtering gas pressure is selected to be 4 Pa to 6 Pa to shorten the mean free path and improve scattering. The mean free path is an average value of the flight distance of a particle (atomic gas etc.) until it collides with another particle (atomic gas etc.), and is obtained from the following equation:

$$\lambda = 3.11 \times 10^{-24} \cdot T/PD^2$$

where $\lambda$ is the mean free path $\lambda$ (m), gas pressure P (Pa), temperature T (K), and the diameter of the particle D (m).

In the case of sputtering, the rare gas pressure is generally about 0.5 to 1 Pa, so the mean free path is set at about 7 mm to 12.5 mm. While in the case of the present invention, since the gas pressure of 4 Pa to 6 Pa is selected and the mean free path is shortened to enhance the scattering effect, the columnar film of the metal oxide is formed in the space portion (Cn) of each hole (Hn) of the substrate (B), so that the mean free path is about 1.0 mm to 1.25 mm at room temperature.

Among metal oxides, for example, silicon oxide can change the film density by adjusting the pressure during film formation.

Specifically, when the pressure during deposition is relatively high, the film density of silicon oxide becomes relatively low, and depending on the shape of the substrate (B) and the deposition surface, this makes it easier to form relatively low-density fibrous silicon oxide in the space portion (Cn) of each hole (Hn).

(d) The Face Spacing and Arrangement Relationship of the Substrate and the Target In the method of manufacturing an antireflection structure of the present invention, it is preferable that the face spacing between the target and the substrate (B) is in a range of 10 to 150 mm.

In addition, in order to form the columnar film of a metal oxide in the space portion (Cn) of each hole (Hn) of the substrate (B), it is preferable that the arrangement relationship between the substrate (B) and the target is within 60 degrees in the normal direction, and it is more preferable to place the substrate and target to face each other.

(e) Sputtering Temperature and Time

In actual sputtering, when the pressure is about 4 Pa to 6 Pa, the sputtered gas does not become hot and is almost at room temperature. Since the deposition speed is proportional to the power, it can be controlled by the power density (W/cm$^2$). The deposition rate is also roughly inversely proportional to the distance between the target and the substrate. The sputtering time can be determined by considering the thickness of the thin film made of metal oxide to be deposited on the surface portion (S) of the substrate (B).

(3) Antireflection Structure Obtained by Sputtering

The antireflection structure obtained by the manufacturing method of the present invention is a structure in which the thin film of metal oxide is deposited on the surface portion (S) of the substrate (B) provided with a plurality of nanometer-sized holes (Hn), and the columnar film of the same metal oxide is deposited in the space portion (Cn) of each hole (Hn) and, thus, is characterized by the deposition of the metal oxide which has such two types of structures. The deposition of thin films on a substrate by sputtering is often done at low temperatures and is a non-equilibrium process. The Thornton model described above is known for the structure and properties of thin films deposited by sputtering.

(3-1) Metal Oxide Film Deposited on the Surface Portion (S) of the Substrate (B)

The thickness (p) of the thin film 14 of metal oxide film deposited on the surface portion (S) 18 of the substrate (B) 11 is preferably 20 nm to 60 nm, and 20 nm to 40 nm is more preferable in consideration of the antireflection function, etc. (reference should be made to FIGS. 1(a) and 1(c)).

When the thickness (p) of the thin film made of metal oxide deposited on the surface portion (S) 18 of the above antireflection structure is about several tens of nm, the orientation is relatively low and the density is relatively high, considering, for example, the SEM image (FIG. 3(b)) of the antireflection structure manufactured in Example 1 herein and the conventional technology. During sputtering, it is assumed that the sputter particles incident on the surface portion (S) 18 of the substrate (B) 11 are partly reflected and partly adhered to the surface, and the adhered sputter particles grow and form the thin film.

(3-2) Columnar Film Deposited in the Space Portion (Cn) of Each Hole (Hn) of the Substrate (B)

The structure of the metal oxide film deposited in the space portion (Cn) of each hole (Hn) 12 of the substrate (B) 11 is determined to be an oriented and fibrous based on, for example, the SEM image (FIG. 3(b)) of the antireflection structure manufactured in Example 1 herein and the Thornton model described above, and its overall shape is determined to be the columnar film (reference should be made to FIGS. 1(a) and 1(c)).

In the space portion (Cn) formed upward from the bottom portions 19 of each of the holes (Hn) 12, the columnar film 15 is preferably arranged in a direction towards the bottom of the holes (Hn) 12 from a position spaced apart by about 120 nm from the uppermost surface portion (Sm) 20 of the thin film-bearing substrate (B) 11, and is more preferably arranged within a depth range of 120 to 250 nm relative to the uppermost surface portion (Sm) 20 of the substrate (B) 11.

During sputtering, the sputter particles incident in the space portion (Cn) of each hole (Hn) 12 of the substrate (B) 11 have more opportunities to collide with other sputter particles, the wall of each hole (Hn), etc., compared to the sputter particles incident on the surface portion (S) 18 of the substrate (B) 11, so that the energy of the sputtered particles decreases, and the probability of sputter particles flying out of the space portion (Cn) of each hole (Hn) 12 decreases.

Namely, it is assumed that the probability of sputter particles ejecting from each hole (Hn) 12 decreases as the depth (dn) of the hole (Hn) 12 becomes larger, making it easier to form the columnar film 15, and as a result, the thickness (tn) of the deposited columnar film 15 increases as the depth (dn) of each hole (Hn) 12 becomes larger.

It is assumed that although the rate of columnar film 15 formation is greater as the depth (dn) of each hole (Hn) 12 becomes larger, differences in depth between the respective holes (Hn) 12 relative to the uppermost surface portion (Sm) 20 of the substrate (B) 11 decreases, since the difference in film formation rate gradually decreases and converges as the formation of the columnar film 15 proceeds.

It is assumed that such a decrease contributes to the improvement in the reflection characteristics (absorption), hydrophilicity, and antifogging property of the obtained antireflection structure.

From the results of Example 3 herein, when the thickness (p) of the thin film formed on the surface portion (S) 18 of the substrate (B) 11 is 25 nm, each depth (fn (nm)) from the uppermost surface portion (Sm) 20 of the substrate (B) 11 to the surface portion 21 of the columnar film in the space portion (Cn) of each hole (Hn) 12 can be obtained from the following equation (iii), as described below.

$$fn=0.195 dn+95.5 \tag{iii}$$

The thickness (tn (nm)) of each columnar film formed in each space portion (Cn) can be obtained from the following equation (iv).

$$tn=(dn+p)-fn \tag{iv}$$

The preferred range of each depth (fn) from the uppermost surface portion (Sm) 20 of the substrate (B) 11 to the surface portion 21 of the columnar film in each hole (Hn) 12 may be determined by generalizing the thickness (p) of the thin film formed on the surface portion (S) 18 of the substrate (B) to preferably a range of 20 nm to 40 nm, more preferably 20 nm to 30 nm, since the tilt value (0.195) in the above equation (iii) is relatively small.

Namely, when the thickness (p) of the thin film formed on the surface portion (S) of the substrate (B) is 20 nm to 40 nm, preferably 20 nm to 30 nm, and the preferable depth (dn) of each hole (Hn) of the substrate (B) is 80 nm to 250 nm, the depth (fn (nm)) of each hole (Hn) from the uppermost surface portion (Sm) of the substrate (B) to the surface portion of the columnar film deposited in the space portion (Cn) of each hole (Hn) is in the range indicated by the following equation (i), which may be obtained from the depth (dn (nm)) of each hole (Hn) before deposition relative to the surface portion (S).

$$fn=[(0.195dn+95.5)+(p-25)] \times 0.90 \text{ to } [(0.195dn+95.5)+(p-25)] \times 1.10 \quad \text{(i)}$$

In equation (i), (p−25) takes into account that the thickness (p) of the thin film deposited on the surface portion (S) of the substrate (B) is in the above range, and the coefficients 0.90 and 1.10 are numerical values indicating the preferred upper and lower limits determined in consideration of the range of variation in depth (fn) in FIG. 4. The unit of the number is nanometer (nm). In the present invention, when more than 90% of the depths (fn) of all the holes (Hn) are included in the range of the above formula (i), the effect of the present invention may be suitably demonstrated.

In the same way as above, when the thickness (p) of the thin film formed on the surface portion (S) of the substrate (B) is 20 nm to 40 nm, preferably 20 nm to 30 nm, and the depth (dn) of each hole (Hn) of the substrate (B) is 80 nm to 250 nm, the more preferable depth (fn (nm)) of each hole (Hn) from the uppermost surface portion (Sm) of the substrate (B) to the surface portion of the columnar film deposited in the space portion (Cn) of each hole (Hn) is in the range indicated by the following equation (ii), which may be obtained from the depth (dn (nm)) of each hole (Hn) before deposition relative to the surface portion (S).

$$fn=[(0.195dn+95.5)+(p-25)] \times 0.95 \text{ to } [(0.195dn+95.5)+(p-25)] \times 1.05 \quad \text{(ii)}$$

In equation (ii), (p−25) takes into account that the thickness (p) of the thin film deposited on the surface portion (S) of the substrate (B) is in the above range, and the coefficients 0.95 and 1.05 are numerical values to indicate the preferred upper and lower limits in consideration of the range of variation in depth (fn) in FIG. 4. The unit of the number is nanometer (nm). In the present invention, when more than 90% of the depths (fn) of all the holes (Hn) are included in the range of the above formula (ii), the effect of the present invention may be suitably demonstrated.

The antireflection structure of the present invention makes it possible to significantly reduce the reflectance in the visible light range of 380 nm to 780 nm. In addition, the antireflection structure obtained by the manufacturing method of the present invention has a thin film and a fibrous columnar film made of a metal oxide deposited on the surface portion (S) and in the space portion (Cn) of each hole (Hn), respectively, and, therefore, has excellent hydrophilicity and anti-fogging properties.

EXAMPLES

The following examples and comparative examples are provided for the purpose of further illustrating the present invention but are in no way to be taken as limiting.

In these examples and comparative examples, the measurement, deposition, and evaluation devices shown in (1) through (4) below were used.

(1) Measurement of the Shape and Depth of the Specimen

Scanning Probe Microscope (SPM) (manufactured by Hitachi High-Technologies, Ltd., Model: AFM 5400) was used.

(2) Film Deposition Apparatus

Magnetron sputtering apparatus (manufactured by SHIBAURA MECHATRONICS CORPORATION, Model: CFS-4 ES) was used.

The power supply was a high frequency alternating current power supply (frequency: 13.56 MHz), and 100 W.

(3) Observation of the Microstructure of the Thin Film and Columnar Film Formed by Sputtering Scanning Electron Microscope (SEM) and Energy Dispersive X-ray Spectroscope (EDX) were used.

(4) Evaluation of Optical Properties

Ultraviolet-visible spectrophotometer (manufactured by Shimadzu Corporation, Model: SolidSpec-3700) was used.

Reference Example 1

In Reference Example 1, a specimen (A) with of the U-shaped cross-sectional holes on the substrate was prepared by injection molding.

(1) Thermoplastic Resin Used for Preparing the Specimen (A)

For preparing the specimen (A), a polycarbonate resin (manufactured by Mitsubishi Engineering Plastics Corporation, product name: Iupilone S-3000 r) was used.

(2) Preparation of Specimens (A-1 to A-3) for Evaluation

The mold used in the injection molding system was a piece mold with multiple inverted U-shaped convex cross-sectional shapes, with an average diameter of 200 nm, a height of 350 nm (in which a molding temperature is adjusted such that a depth of a molded article is 90 to 230 nm), and an average distance of 250 nm between the center points of adjacent U-shaped horizontal cross sections.

Using the above molds, several specimens (A-1), (A-2), and (A-3) were molded respectively by the injection molding method with the mold temperature set at 110° C., 120° C., and 130° C., respectively. The above three mold temperature conditions were selected in order to create specimens with different hole depths respectively by changing the mold transfer rate. The size of the specimens (A-1 to A-3) was 35 mm×35 mm and 1.5 mm thick. The reverse pattern of the surface structure of the above piece mold was formed on one side surface of the specimens (A-1 to A-3). The SEM image of the specimen (A-2) observed from the upper side of its surface is shown in FIG. 3(a).

The geometry of the holes in the above specimens (A-1 to A-3) were as follows: the average diameter of the openings (average diameter of normal distribution) was 200 nm, the average distance (k) between the center points of openings of the adjacent holes was 250 nm, and the ratio of an opening portion on the surface portion (S) was 60%. As shown in FIG. 4, for specimen (A-2), the maximum depth was 230 nm, the minimum depth was 80 nm, and the average diameter of the openings was 200 nm as described above.

In the average hole diameter, when the openings was not a perfect circle, the diameter of each hole is the average of the long and short diameters of the hole, and the average distance (k) of the openings is the average value obtained by measuring the distance between the center points, and when the hole was not a circular shape, the point of intersection of the lines indicating the long diameter and the short diameter of each hole was set as the center point.

Example 1

(1) Preparation of Specimens (B-1 to B-3) for Evaluation

The specimen (B-1), (B-2), and (B-3) in which the thin film and the columnar film of silicon oxide were formed on the surface portion and in the space portions of the holes of the above-mentioned specimens (A-1), (A-2), and (A-3) respectively were manufactured under the following condition using the above-mentioned magnetron sputtering apparatus.
 (a) Target material: silicon oxide
 (b) Deposition gas: A mixture of argon gas and oxygen gas (argon/oxygen molar ratio: 75/25)
 (c) The distance between specimens (A-1 to A-3) and target: 80 mm
 (d) Gas pressure: 4 Pa
 (e) Sputtering time: 30 min (the time required to form a thin film with a thickness of 25 nm on the surface portion)
 (f) Specimen temperature: room temperature

(2) Evaluation Results

The above sputtering conditions and results are summarized in Table 1. For the specimen (B-2), the maximum depth was 130 nm, the minimum depth was 110 nm, and the average diameter of the opening was 200 nm. FIG. 3(b) shows SEM image of the specimen (B-2) obtained by sputtering observed from an upper side of the surface.

From the results of the above SEM observation of the specimens (B-1) to (B-3) obtained by sputtering, it is judged that the silicon oxide film deposited on the surface portion was almost not oriented and is a thin film having a relatively high density, and the silicon oxide film deposited in the space portion of the hole is fibrous columnar film as in the case of the specimen (B-2) shown in FIG. 3(b).

Example 2

(1) Preparation of Specimens (B-4 to B-6) for Evaluation

Using the above magnetron film sputtering apparatus, specimens (B-4), (B-5), and (B-6) were manufactured by forming thin film and columnar film of silicon oxide on the surface portion and in the space portions of the holes of the above specimens (A-1), (A-2), and (A-3), respectively, under the conditions in which the gas pressure was changed to 6 Pa, and other conditions such as the mixing ratio of gases for sputtering were the same as in Example 1.

(2) Evaluation Results

The above sputtering conditions and results are summarized in Table 1. For specimens (B-4), (B-5), and (B-6), the maximum depth, minimum depth, and average diameter of the openings were almost the same as for specimen (B-2) above. For specimens (B-4), (B-5), and (B-6), as with specimen (B-2) above, it was determined that the silicon oxide films deposited on the surface portions were thin films with little orientation and relatively high density, and the silicon oxide films deposited in the space portions of the holes were fibrous columnar films.

Comparative Examples 1 and 2

(1) Preparation of Specimens (C-1) to (C-6) for Evaluation

Using the above-mentioned magnetron sputtering apparatus, specimens (C-1), (C-2), and (C-3) in Comparative Example 1, and specimens (C-4), (C-5), and (C-6) in Comparative Example 2 were manufactured by forming film of silicon oxide on the surface portion and in the space portions of the holes of the above specimens (A-1), (A-2), and (A-3), respectively, under the conditions in which the gas pressure was changed to 0.7 Pa and 2 Pa for Comparative Examples 1 and 2, respectively, and other conditions such as the mixing ratio of gases for sputtering were the same as in Example 1 as shown in Table 2.

(2) Evaluation Results

The above sputtering conditions and results are summarized in Table 2. FIG. 3(c) shows the SEM image of the specimen (C-5) obtained by the above sputtering, which was observed from the upper side of the surface.

For specimens (C-1) through (C-6) obtained by sputtering, as with specimen (C-5) above, it was determined that the silicon oxide films formed on the surface portion of each specimen, were thin films with little orientation and relatively high density, and the silicon oxide films deposited in the space portions of the holes were also thin films with little orientation and relatively high density.

TABLE 1

|  | Example 1 | | | Example 2 | | |
|---|---|---|---|---|---|---|
| Specimen number | B-1 | B-2 | B-3 | B-4 | B-5 | B-6 |
| (1) Molding condition of specimens | | | | | | |
| Mold temperature in injection molding machine | 110° C. | 120° C. | 130° C. | 110° C. | 120° C. | 130° C. |
| (2) Sputtering conditions | | | | | | |
| Target material | $SiO_2$ | $SiO_2$ | $SiO_2$ | $SiO_2$ | $SiO_2$ | $SiO_2$ |
| Sputtering gas | Ar, $O_2$ | Ar, $O_2$ | Ar, $O_2$ | Ar, $O_2$ | Ar, $O_2$ | Ar, $O_2$ |
| Gas pressure | 4 Pa | 4 Pa | 4 Pa | 6 Pa | 6 Pa | 6 Pa |
| Sputtering time | 30 min. | 30 min. | 30 min. | 30 min. | 30 min. | 30 min. |
| (3) Results | | | | | | |
| Film thickness of surface portion | 25 nm | 25 nm | 25 nm | 25 nm | 25 nm | 25 nm |

TABLE 1-continued

Figure 3:
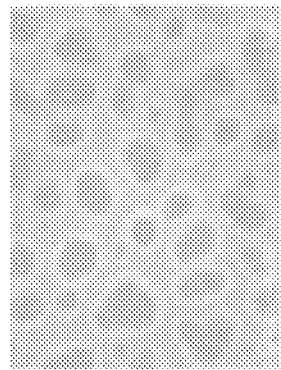
FIGS. 3(a), (b), and (c) are scanning electron microscope (SEM) images of specimens (A-2), (B-2), and (C-5) obtained in Reference Example 1, Example 1, and Comparative Example 2, respectively, observed from the upper side of the surface.
Figure 3:
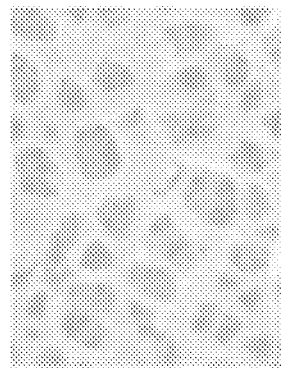
Figure 3:
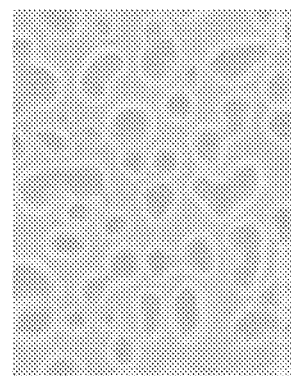

| | Example 1 | | | Example 2 | | |
|---|---|---|---|---|---|---|
| Specimen number | B-1 | B-2 | B-3 | B-4 | B-5 | B-6 |
| Structure of deposited film | | | | | | |
| Surface portion | X *1 | X | X | X | X | X |
| Space portion | Y *2 | Y | Y | Y | Y | Y |
| (4) Drawing No. in FIG. 3 | — | FIG. 3 (b) | — | — | — | — |

*1 X indicates a thin film with almost no orientation and relatively high density.
*2 Y indicates a fibrous columnar film.

TABLE 2

| | Comp. Example 1 | | | Comp. Example 2 | | |
|---|---|---|---|---|---|---|
| Specimen number | C-1 | C-2 | C-3 | C-4 | C-5 | C-6 |
| (1) Molding conditions of specimens | | | | | | |
| Mold temperature in injection molding machine | 110° C. | 120° C. | 130° C. | 110° C. | 120° C. | 130° C. |
| (2) Sputtering conditions | | | | | | |
| Target material | $SiO_2$ | $SiO_2$ | $SiO_2$ | $SiO_2$ | $SiO_2$ | $SiO_2$ |
| Sputtering gas | Ar, $O_2$ | Ar, $O_2$ | Ar, $O_2$ | Ar, $O_2$ | Ar, $O_2$ | Ar, $O_2$ |
| Gas pressure | 0.7 Pa | 0.7 Pa | 0.7 Pa | 2 Pa | 2 Pa | 2 Pa |
| Sputtering time | 8 min. | 8 min. | 8 min. | 8 min. | 8 min. | 8 min. |
| (3) Results | | | | | | |
| Film thickness of surface portion | 25 nm | 25 nm | 25 nm | 25 nm | 25 nm | 25 nm |
| Structure of deposited film | | | | | | |
| Surface portion | X *1 | X | X | X | X | X |
| Space portion | X *1 | X | X | X | X | X |
| (4) Drawing No. in FIG. 3 | — | — | — | — | FIG. 3 (c) | — |

*1 X indicates a thin film with almost no orientation and relatively high density.

Example 3 and Comparative Example 3

In Example 3, the depth of each hole from the uppermost surface portion (Sm) of the specimen (B-2) manufactured in Example 1 above and the specimen (C-5) manufactured in Comparative Example 2 above was measured in a depth range of 94 nm to 222 nm based on the specimen (A-2) using the scanning probe microscope (SPM). For the specimen (A-2) manufactured in Reference Example 1, the position of the hole to be measured was identified in advance from the shape of the opening of the hole, etc., and the depth of each hole from the uppermost surface portion (Sm) after sputtering was measured. The measurement results are shown in FIG. 4.

In the descriptions of Examples 3 and 4 and Comparative Examples 3 and 4, and in FIGS. 4 to 10, specimen (A-2) is also referred to as specimen (A), specimen (B-2) as specimen (B), and specimen (C-5) as specimen (C).

For line B-C in FIG. 4, the horizontal axis represents a depth (nm) of each hole at an arbitrary position provided in the specimen (A) before deposition, and the vertical axis represents a depth from the uppermost surface portion (Sm) to the bottom of the hole before deposition in the specimen (B).

For line A-D, the horizontal axis represents a depth (nm) of each hole at an arbitrary position provided in the specimen (A) before deposition, and the vertical axis represents a depth from the uppermost surface portion (Sm) to the surface portion of the thin film deposited in the space portions of the holes in the specimen (C). For line B-E, the horizontal axis represents a depth (nm) of each hole at an arbitrary position provided in the specimen (A) before deposition, and the vertical axis represents a depth of the hole from the uppermost surface portion (Sm) to the surface portion of the columnar film in the specimen (B).

From FIG. 4, it is seen that, in the specimen (B), which was deposited under the sputtering conditions of the present invention using the specimen (A), the thickness of the columnar film increased as the depth of the hole before deposition became larger, and as a result, a structure in which differences in depths of the respective holes from the uppermost surface portion (Sm) were reduced was manufactured. On the other hand, in the specimen (C) in which the film was formed under the known sputtering condition using the specimen (A), the thin film having a constant thickness was deposited on the surface portion and in the space portions of the holes regardless of the depth of the hole before the film formation.

In FIG. 4, the depth (fn) from the uppermost surface portion (Sm) of the substrate (B) to the surface portion of the columnar film in the space portion (Cn) of each hole (Hn) and the thickness (tn) of columnar film in each space portions (Cn) are obtained from the following procedures (a) to (c).

(a) The hypothetical depth (dn') of the hole (Hn) before deposition relative to the uppermost surface portion (Sm) of the substrate (B) is represented by the line B-C in FIG. 4, which is indicated by "dn'=dn+thickness (p) of the film".

(b) The depth (fn) from the uppermost surface portion (Sm) of the substrate (B) to the surface portion of the columnar film in the space portion (Cn) of each hole (Hn) is represented by the line B-E in FIG. 4, so the following equation (iii) can be obtained from its slope and the contact point with the vertical axis at dn=0 from FIG. 4.

$$fn = 0.195 dn + 95.5 \tag{iii}$$

(c) Since the thickness (tn) of the columnar film is obtained by subtracting line B-E from line B-C, the following equation (iv) is obtained.

$$tn = (dn+p) - fn \tag{iv}$$

Example 4 and Comparative Example 4

The relationship between the wavelength of incident light and the reflectance of incident light at an incident light angle of 5 degrees was measured for the depth (fn) of each hole after deposition corresponding to the given hole depth (dn) before deposition, using the specimen (A) as a reference example before deposition, and the specimen (B) of Example 1 and specimen (C) of Comparative Example 2 after deposition. The measurement results are shown in FIGS. 5, 6, and 7.

When comparing and evaluating the specimen (C) of Comparative Example 2 with the specimen (A) of Reference Example 1 in FIGS. 7 and 5, it was confirmed that the reflectance of the specimen (C) of Comparative Example 2 was somewhat reduced. On the other hand, when the specimen (B) of Example 1 is compared and evaluated with the specimen (A) of Reference Example 1 in FIGS. 6 and 5, it is confirmed that the light reflectance of the specimen (B) of Example 1 is significantly reduced in the visible light range of 380 nm to 780 nm.

Example 5 and Comparative Example 5

The relationship between the wavelength of incident light and the reflectance of incident light was measured when the angle of incident light was varied in the range from 5 degrees to 70 degrees using the specimen (A) of Reference Example, the specimen (B) of Example 1, and the specimen (C) of Comparative Example 2. The measurement results are shown in FIGS. 8, 9, and 10.

When comparing and evaluating the specimen (C) of Comparative Example 2 with the specimen (A) of Reference Example 1 in FIGS. 10 and 8, it was confirmed that the reflectance of incident light against the angle of incident light was slightly lower in the specimen (C) of Comparative Example 2. When comparing and evaluating the specimen (B) of Example 1 and the specimen (A) of Reference Example 1 in FIGS. 9 and 8 in the visible light range of 380 nm to 780 nm, it was confirmed that the reflectance of incident light of the specimen (B) of Example 1 was significantly reduced in the angle of incident light from 5 to 60 degrees.

Example 6 and Comparative Example 6

The static contact angle (θ) was measured by a droplet method for the specimens (B-1 to B-3) manufactured in Example 1 and the specimens (C-4 to C-6) manufactured in Comparative Example 2. For measurement of the static contact angle, a contact angle meter DM-501 manufactured by Kyowa Interface Science Co., Ltd. was used.

In the droplet method, when droplets of 1 μL in pure water were brought into contact with a solid surface and dropped, an angle (static contact angle θ) formed between the droplet and the sample surface was measured.

The measurement results are shown in Table 3. From Table 3, it was confirmed that all of the specimens (B-1 to B-3) manufactured in Example 1 have better hydrophilicity than the specimens (C-4 to C-6) manufactured in Comparative Example 2.

TABLE 3

| | Example 6 | | | Comp. Example 6 | | |
|---|---|---|---|---|---|---|
| Specimen number | B-1 | B-2 | B-3 | C-4 | C-5 | C-6 |
| (1) Molding conditions of specimens | | | | | | |
| Mold temperature in injection molding machine | 110° C. | 120° C. | 130° C. | 110° C. | 120° C. | 130° C. |
| (2) Sputtering conditions | | | | | | |
| Target material | $SiO_2$ | $SiO_2$ | $SiO_2$ | $SiO_2$ | $SiO_2$ | $SiO_2$ |
| Sputtering gas | Ar, $O_2$ | Ar, $O_2$ | Ar, $O_2$ | Ar, $O_2$ | Ar, $O_2$ | Ar, $O_2$ |
| Gas pressure | 6 Pa | 6 Pa | 6 Pa | 2 Pa | 2 Pa | 2 Pa |
| Sputtering time | 30 min. | 30 min. | 30 min. | 8 min. | 8 min. | 8 min. |
| (3) Results | | | | | | |
| Film thickness of surface portion | 25 nm | 25 nm | 25 nm | 25 nm | 25 nm | 25 nm |
| Contact angle | 12.0 deg. | 15.8 deg. | 8.1 deg. | 43.3 deg. | 46.6 deg. | 48.4 deg. |
| (4) Drawing No. in FIG. 3 | — | FIG. 3 (b) | — | — | FIG. 3(c) | — |

EXPLANATION OF NUMERALS

11 Substrate (B)
12 Nanometer-sized hole (Hn)
13 Metal oxide film formed by known method
14 Thin film of metal oxide film
15 Columnar film of metal oxide film
16 Upper mold for injection molding
17 Lower mold for injection molding

What is claimed is:

1. An antireflection structure comprising:
   a transparent substrate (B) having a plurality of holes (Hn) with U-shaped or V-shaped cross-sectional shapes in a direction perpendicular to a flat surface portion thereof, and
   a metal oxide film disposed on a surface portion (S) of the transparent substrate (B) and in space portions (Cn) formed in an upward direction from bottom portions of the holes (Hn) of the transparent substrate (B),
   wherein each of the holes (Hn) has a geometry in which an average diameter (m) of openings of the holes (Hn)

is 50 nm to 300 nm, an average distance (k) between center points of the openings of adjacent holes (Hn) is 100 nm to 400 nm, and a depth (dn) of each hole (Hn) from the surface portion (S) is 80 nm to 250 nm, a thickness (tn) of the metal oxide film disposed in each of the space portions (Cn) increases as the depth (dn) of each of the holes (Hn) becomes larger so that differences in depth (fn) between the respective holes (Hn) from an uppermost surface portion (Sm) of the metal oxide film disposed on the surface portion (S) to a surface portion of the metal oxide film in the space portion (Cn) are reduced, and the metal oxide film disposed on the surface portion (S) of the substrate (B) is a thin film, and the metal oxide film disposed in the space portion (Cn) in an upper direction from the bottom of each hole (Hn) is a fibrous columnar film.

2. The antireflection structure according to claim 1, wherein an arithmetic average roughness (Ra) of the surface portion (S) of the substrate (B) is 50 nm or less, and a percentage of the area of the opening portions (aperture ratio) (r) of the surface portion (S) is 50 to 80 area %.

3. The antireflection structure according to claim 1, wherein the thickness (p) of the metal oxide film disposed on the surface portion (S) of the substrate (B) is 20 to 60 nm.

4. The antireflection structure according to claim 1, wherein the thickness (p) of a metal oxide film disposed on the surface portion (S) of the substrate (B) is 20 nm to 40 nm, and the depth (fn (nm)) of each of the holes (Hn) from the uppermost surface portion (Sm) of the substrate (B) to the surface portion of the metal oxide film disposed in the space portion (Cn) in the upper direction from the bottom of the hole (Hn) falls within the range represented by the following formula (i), $$fn=[(0.195dn+95.5)+(p-25)]\times 0.90 \text{ to } [(0.195dn+95.5)+(p-25)]\times 1.10 \quad (i)$$

where the depth of each hole (Hn) from the surface portion (S) is represented by dn (nm), and the thickness of the metal oxide film disposed on the surface portion (S) is represented by p (nm).

5. The antireflection structure according to claim 1, wherein the thickness (p) of the metal oxide film disposed on the surface portion (S) of the substrate (B) is 20 nm to 40 nm, and the depth (fn (nm)) of each hole (Hn) from the uppermost surface portion (Sm) of the substrate (B) to the surface portions of the metal oxide films formed in the space portions (Cn) in the upper direction from the bottom of the holes (Hn) falls within the range represented by the following formula (ii), $$fn=[(0.195dn+95.5)+(p-25)]\times 0.95 \text{ to } [(0.195dn+95.5)+(p-25)]\times 1.05 \quad (ii)$$

where the depth of each hole (Hn) from the surface portion (S) is represented by dn (nm), the thickness of the metal oxide films disposed on the surface portion (S) is represented by p (nm).

6. The antireflection structure according to claim 1, wherein the metal oxide forming the metal oxide film is one of silicon oxide, aluminum oxide, titanium oxide, and zirconium oxide.

7. The antireflection structure according to claim 6, wherein the metal oxide film formed on the surface portion (S) and the metal oxide films formed in the space portions (Cn) in the upper direction from the bottom of each hole (Hn) are films depositing by a vacuum film deposition apparatus having a plasma source.

8. A method for manufacturing an antireflection structure, comprising:

depositing a metal oxide film on a transparent substrate (B) having a plurality of holes (Hn) with a U-shaped or V-shaped cross-sectional shape in a direction perpendicular to a flat surface portion thereof, wherein each of the holes (Hn) has a geometry in which an average diameter (m) of an opening of the holes (Hn) is 50 nm to 300 nm, an average distance (k) between the center points of openings of the adjacent holes (Hn) is 100 nm to 400 nm, and a depth (dn) of each of holes (Hn) from the surface portion (S) is 80 nm to 250 nm, and said depositing is by vacuum deposition that is carried out under the following conditions (a), (b), and (c) by using a vacuum film deposition apparatus having a plasma source, (a) a target is a metal oxide (M) or a metal (K) that constitutes the metal oxide (M), (b) a gas supplied to the vacuum chamber is a rare gas or a rare gas and an oxygen gas, and (c) a gas pressure in the vacuum chamber is 4 to 6 pascals, in such a way that a thin film and columnar films consisting of the metal oxide (M) are deposited on the surface portion (S) and in space portions (Cn) formed in an upward direction from the bottom portions of the holes (Hn), respectively.

9. The method of manufacturing the antireflection structure according to claim 8, wherein a thickness (tn) of the columnar metal oxide film deposited in each space portion (Cn) of the substrate (B) increases as the depth (dn) of each of the holes (Hn) become larger so that differences in depth (fn) between the respective holes (Hn) from an uppermost surface portion (Sm) of the thin film deposited on the surface portion (S) to a surface portion of the metal oxide film in the space portion (Cn) are reduced.

10. The method for manufacturing the anti-reflection structure according to claim 8, wherein the vacuum film deposition apparatus having a plasma source is a sputtering apparatus.

11. The method for manufacturing the antireflection structure according to claim 8, wherein the metal oxide (M) forming the metal oxide film is any one of silicon oxide, aluminum oxide, titanium oxide and zirconium oxide.

12. The method of manufacturing the antireflection structure according to claim 8, wherein the target is the metal oxide (M) constituted of silicon oxide, aluminum oxide, titanium oxide or zirconium oxide, or the metal (K) constituted of silicon (Si), aluminum (Al), titanium (Ti) or zirconium (Zr).

13. The method for manufacturing the antireflection structure according to claim 8, wherein the gas supplied to the vacuum chamber is an argon gas or an argon gas and an oxygen gas.

14. The method for manufacturing the antireflection structure according to claim 8, wherein a thickness (p) of the thin film made of the metal oxide (M) deposited on the surface portion (S) is 20 nm to 60 nm.

15. The method for manufacturing the antireflection structure according to claim 8, wherein when the thin film made of a metal oxide (M) having the thickness (p) of 20 to 40 nm is deposited on the surface portion (S) of the substrate (B) by using the vacuum film deposition apparatus having the plasma source, the depth (fn (nm)) of each hole (Hn) from the uppermost surface portion (Sm) of the substrate (B) to the surface portion of the metal oxide film deposited in the space portion (Cn) formed in the upward direction from the bottom portion of each hole (Hn) falls within the range represented by the following formula (i):

$$fn=[(0.195dn+95.5)+(p-25)]\times 0.90 \text{ to } [(0.195dn+95.5)+(p-25)]\times 1.10 \quad \text{(i)}$$

where the depth of each hole (Hn) from the surface portion (S) is represented by (dn (nm)) and the thickness of the metal oxide film deposited on the surface portion (S) is represented by (p (nm)) so that differences in depth (fn) between the respective holes (Hn) are reduced.

16. The method for manufacturing the antireflection structure according to claim 8, wherein when the thin film made of a metal oxide (M) having the thickness (p) of 20 to 40 nm is deposited on the surface portion (S) of the substrate (B) by using the vacuum film deposition apparatus having the plasma source, the depth (fn (nm)) of each hole (Hn) from the uppermost surface portion (Sm) of the substrate (B) to the surface portion of the metal oxide film deposited in the space portion (Cn) formed in the upward direction from the bottom portion of each hole (Hn) falls within the range represented by the following formula (ii):

$$fn=[(0.195dn+95.5)+(p-25)]\times 0.95 \text{ to } [(0.195dn+95.5)+(p-25)]\times 1.05 \quad \text{(ii)}$$

where the depth of each hole (Hn) from the surface portion (S) is represented by (dn (nm)) and the thickness of the metal oxide film deposited on the surface portion (S) is represented by (p (nm)) so that differences in depth (fn) between the respective holes (Hn) are reduced.

\* \* \* \* \*